(12) United States Patent
Oishi et al.

(10) Patent No.: US 7,373,213 B2
(45) Date of Patent: *May 13, 2008

(54) MANAGEMENT SYSTEM AND APPARATUS, METHOD THEREFOR, AND DEVICE MANUFACTURING METHOD

(75) Inventors: Satoru Oishi, Tochigi (JP); Hideki Ina, Kanagawa (JP); Takehiko Suzuki, Saitama (JP); Koichi Sentoku, Tochigi (JP); Takahiro Matsumoto, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 366 days.

This patent is subject to a terminal disclaimer.

(21) Appl. No.: 10/901,106

(22) Filed: Jul. 29, 2004

(65) Prior Publication Data

US 2005/0137837 A1    Jun. 23, 2005

Related U.S. Application Data

(62) Division of application No. 10/423,893, filed on Apr. 28, 2003, now Pat. No. 6,785,583.

(30) Foreign Application Priority Data

Apr. 30, 2002    (JP)    ............................... 2002-129324

(51) Int. Cl.
*G06F 19/00* (2006.01)
(52) U.S. Cl. ......................................... 700/108; 700/28
(58) Field of Classification Search ................. 700/108, 700/28, 29, 51; 703/2
See application file for complete search history.

(56) References Cited

U.S. PATENT DOCUMENTS

| 4,634,240 A | 1/1987 | Suzuki et al. ............... 350/508 |
| 4,635,373 A | 1/1987 | Miyazaki et al. ......... 33/180 R |
| 4,645,924 A | 2/1987 | Suzuki et al. ............... 250/236 |

(Continued)

FOREIGN PATENT DOCUMENTS

EP    1 248 154 A1    10/2002

(Continued)

OTHER PUBLICATIONS

Korean Office Action dated May 23, 2005, issued in a corresponding Korean patent application, No. 10-2003-0027396, with English translation.

(Continued)

*Primary Examiner*—Albert W. Paladini
(74) *Attorney, Agent, or Firm*—Fitzpatrick, Cella, Harper & Scinto

(57) ABSTRACT

A management apparatus which manages a parameter for an industrial device acquires AGA measurement results obtained by operating the industrial device with an operation job parameter value and non-operation job parameter value. An inspection apparatus acquires an "inspection result" obtained by inspecting the result of operating the industrial device in the operation job. A change in inspection result upon a change in parameter value is estimated on the basis of the AGA measurement result and inspection result. A variable which minimizes (extreme) both or at least one of the sensitivity (slope) of the inspection result upon a change in parameter value and variations ($3\sigma$) in inspection result between objects to be processed (e.g., wafers) is set as an optimal parameter.

10 Claims, 18 Drawing Sheets

U.S. PATENT DOCUMENTS

| | | | |
|---|---|---|---|
| 4,669,883 A | 6/1987 | Ina et al. | 356/401 |
| 4,669,885 A | 6/1987 | Ina | 356/443 |
| 4,780,617 A | 10/1988 | Umatate et al. | 250/548 |
| 4,834,540 A | 5/1989 | Totsuka et al. | 356/401 |
| 4,861,162 A | 8/1989 | Ina | 356/401 |
| 4,886,974 A | 12/1989 | Ina | 250/561 |
| 4,901,109 A | 2/1990 | Mitome et al. | 355/68 |
| 4,958,160 A | 9/1990 | Ito et al. | 355/53 |
| 5,243,377 A | 9/1993 | Umatate et al. | 355/53 |
| 5,249,016 A | 9/1993 | Tanaka | 355/53 |
| 5,586,059 A | 12/1996 | Oshelski et al. | 364/552 |
| 5,659,384 A | 8/1997 | Ina | 355/53 |
| 5,682,239 A | 10/1997 | Matsumoto et al. | 356/349 |
| 5,742,406 A | 4/1998 | Suzuki | 358/468 |
| 5,805,866 A | 9/1998 | Magome et al. | 395/500 |
| 5,847,974 A | 12/1998 | Mori et al. | 364/571.02 |
| 5,937,069 A | 8/1999 | Nagai et al. | 380/49 |
| 5,993,043 A | 11/1999 | Fujii | 364/468.28 |
| 6,124,922 A | 9/2000 | Sentoku | 355/53 |
| 6,151,120 A | 11/2000 | Matsumoto et al. | 356/399 |
| 6,154,281 A | 11/2000 | Sentoku et al. | 356/401 |
| 6,198,181 B1 | 3/2001 | Ali et al. | 310/42 |
| 6,223,133 B1 | 4/2001 | Brown | 702/85 |
| 6,275,988 B1 | 8/2001 | Nagashima et al. | 725/8 |
| 6,311,096 B1 | 10/2001 | Saxena et al. | 700/121 |
| 6,333,786 B1 | 12/2001 | Uzawa et al. | 356/401 |
| 6,338,971 B1 | 1/2002 | Yasuda et al. | 438/14 |
| 6,344,892 B1 | 2/2002 | Sugita et al. | 355/53 |
| 6,470,230 B1 | 10/2002 | Toprac et al. | 700/121 |
| 6,493,065 B2 | 12/2002 | Ina et al. | 355/53 |
| 6,559,924 B2 | 5/2003 | Ina et al. | 355/53 |
| 6,563,573 B1 | 5/2003 | Morohoshi et al. | 356/124 |
| 6,607,926 B1 | 8/2003 | Toprac et al. | 438/7 |
| 6,785,583 B2 * | 8/2004 | Oishi et al. | 700/108 |
| 2001/0020946 A1 | 9/2001 | Kawakami et al. | 345/582 |
| 2001/0043326 A1 | 11/2001 | Ina et al. | 356/237.4 |
| 2002/0014601 A1 | 2/2002 | Yoshida | 250/548 |
| 2002/0046140 A1 | 4/2002 | Kano et al. | 705/27 |
| 2002/0051125 A1 | 5/2002 | Suzuki | 355/53 |
| 2002/0100013 A1 | 7/2002 | Miwa et al. | 716/21 |
| 2002/0111038 A1 | 8/2002 | Matsumoto et al. | 438/763 |
| 2002/0175300 A1 | 11/2002 | Suzuki et al. | 250/548 |
| 2002/0176096 A1 | 11/2002 | Sentoku et al. | 356/620 |
| 2002/0180983 A1 | 12/2002 | Ina et al. | 356/511 |
| 2003/0012373 A1 | 1/2003 | Ogura et al. | 380/30 |
| 2003/0022396 A1 | 1/2003 | Ogawa | 438/7 |
| 2003/0071980 A1 | 4/2003 | Ina et al. | 355/53 |
| 2003/0119216 A1 | 6/2003 | Weed | 438/14 |
| 2003/0121022 A1 | 6/2003 | Yoshitake et al. | 716/21 |
| 2003/0202182 A1 | 10/2003 | Matsumoto et al. | 356/401 |
| 2003/0204282 A1 | 10/2003 | Oishi et al. | 700/108 |
| 2003/0204348 A1 | 10/2003 | Suzuki et al. | 702/83 |
| 2003/0204488 A1 | 10/2003 | Sentoku et al. | 707/1 |

FOREIGN PATENT DOCUMENTS

| | | |
|---|---|---|
| JP | 3-185807 | 8/1991 |
| JP | 10-163286 | 6/1998 |
| JP | 2000-81712 | 3/2000 |
| JP | 2000-306815 | 11/2000 |
| JP | 2001-274068 | 10/2001 |
| JP | 2001-319452 | 11/2001 |
| JP | 2002-301868 | 10/2002 |
| KR | 2003-0032871 | 4/2003 |

OTHER PUBLICATIONS

European Search Report dated Jul. 4, 2005, issued in corresponding European patent application No. EP 03 00 9611, forwarded in a Communication dated Jul. 22, 2005.

Lee, C., et al., "Reducing CD Variation via Statistically Matching Steppers," *SPIE*, vol. 1261, *Integrated Circuit Metrology, Inspection and Process Control IV*, (Mar. 1990). pp. 63-70.

van den Brink, M.A., et al. "Matching Management of Multiple Wafer Steppers Using a Stable Standard and a Matching Simulator," *SPIE*, vol. 1087, *Integrated Circuit Metrology, Inspection, and Process Control III* (Feb. 1989). pp. 218-232.

Japanese Office Action dated Feb. 19, 2007, issued in corresponding Japanese patent application No. 2002-129325, with English translation.

* cited by examiner

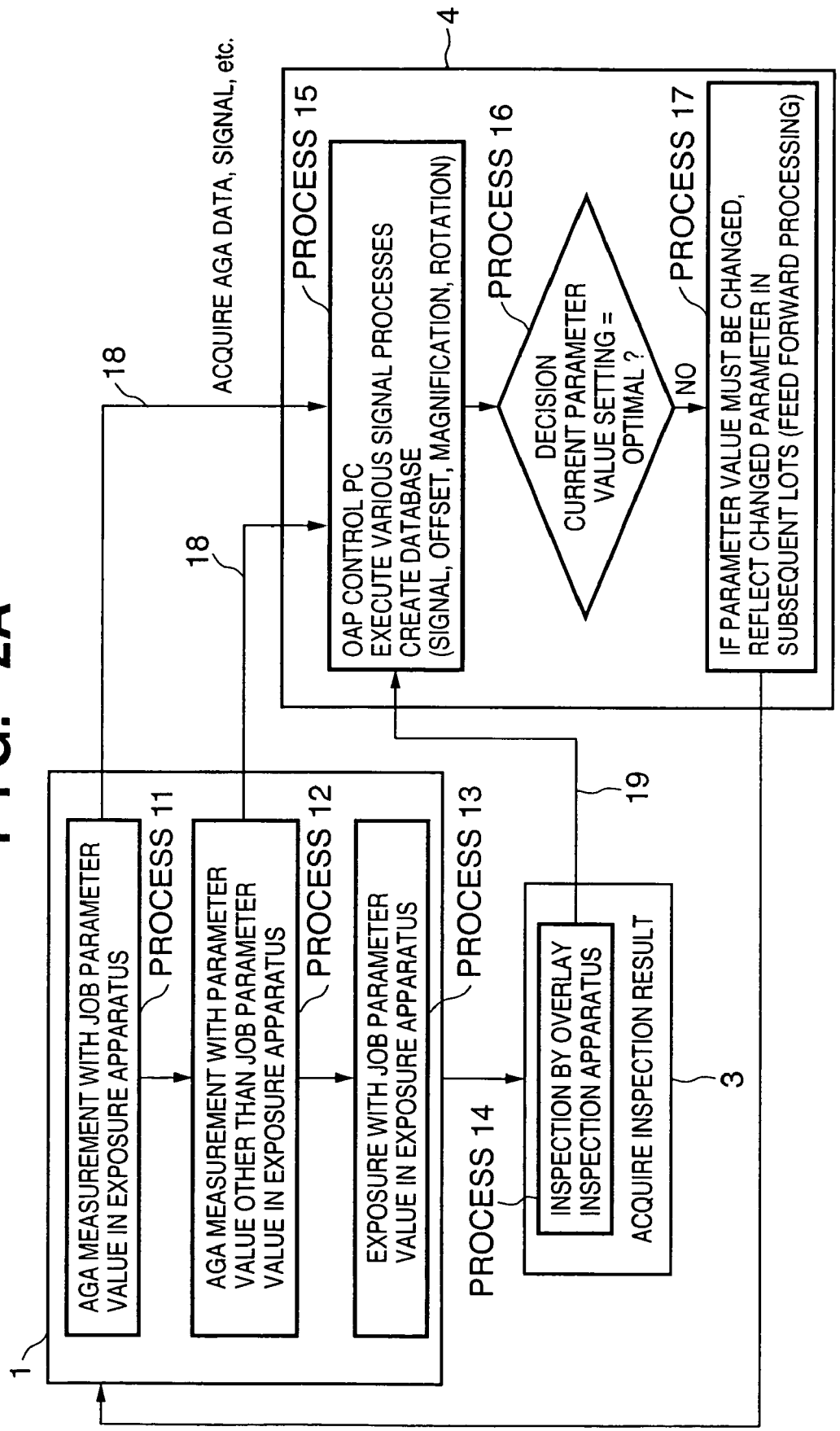

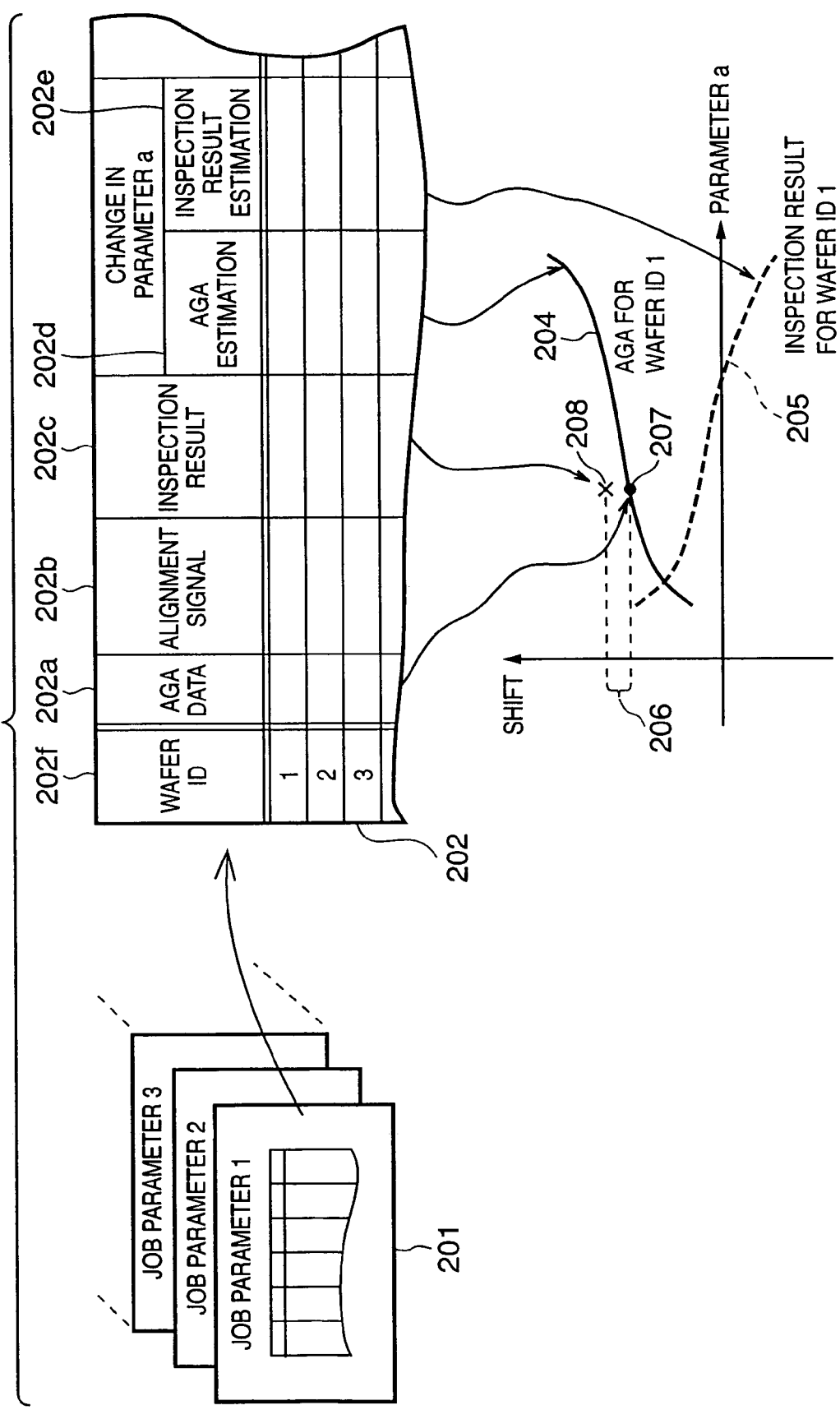

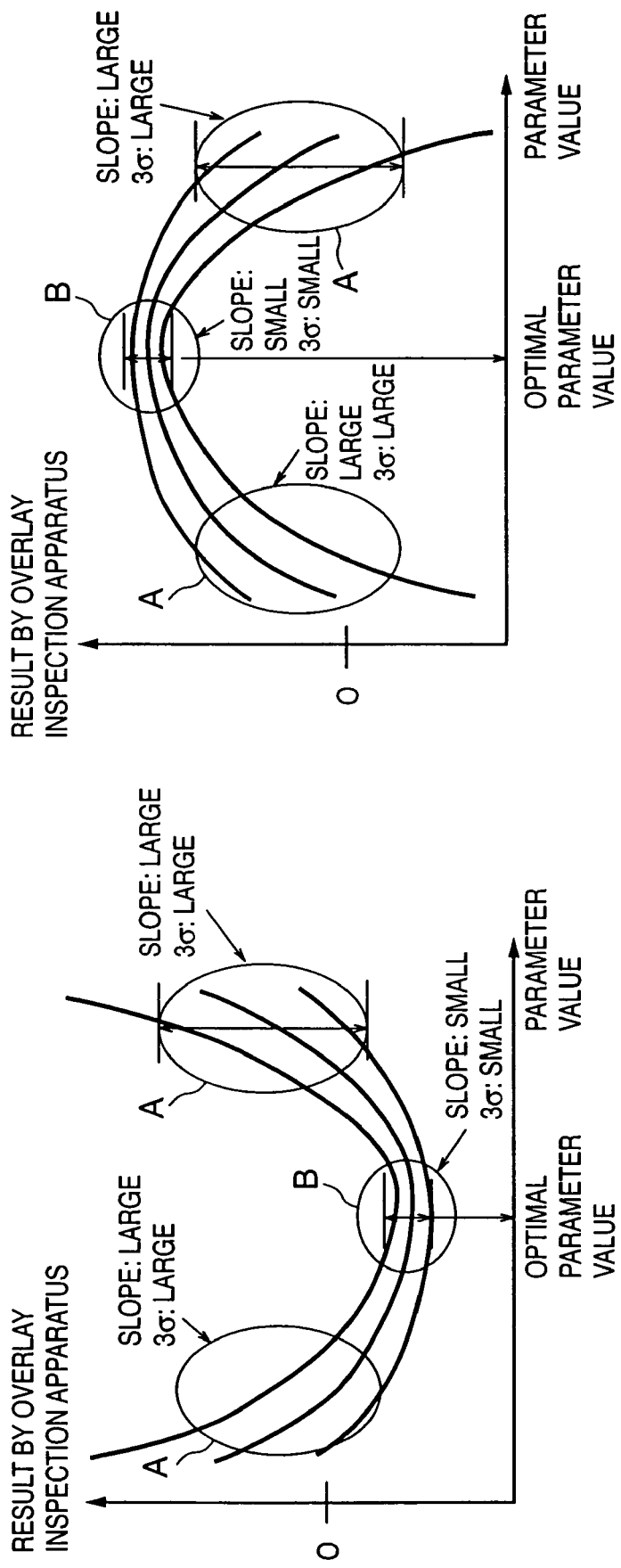

F I G. 10
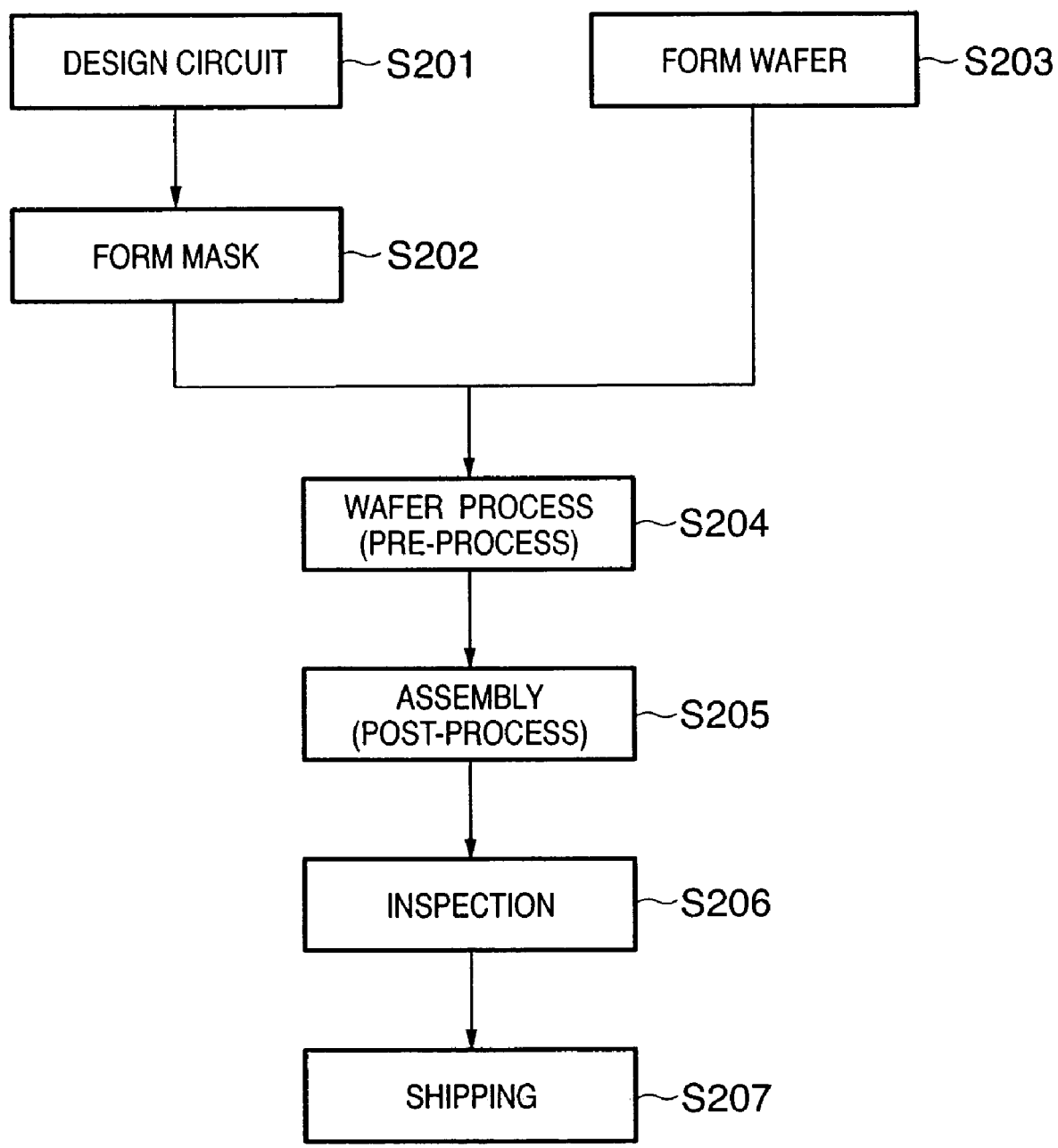

F I G. 14A
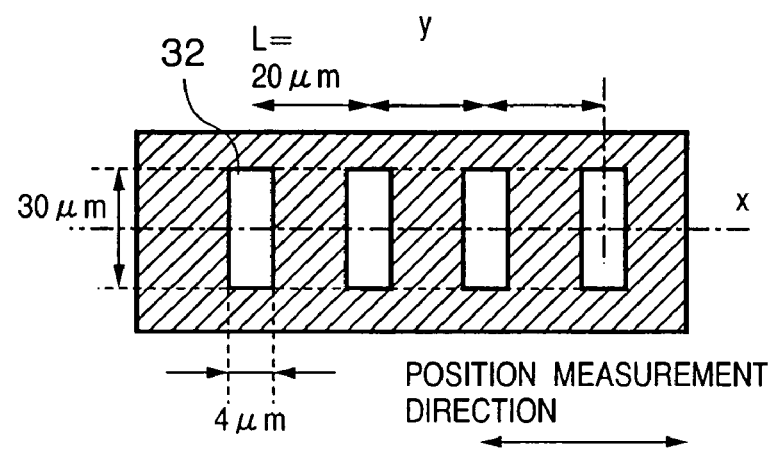
F I G. 14B
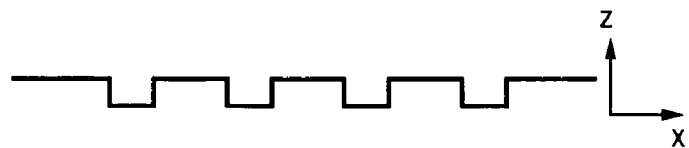

SIGNAL PROCESSING METHOD

ML : MARK WIDTH

MLW : MARK LINE WIDTH

AGA SAMPLE SHOT POSITION

MANAGEMENT SYSTEM AND APPARATUS, METHOD THEREFOR, AND DEVICE MANUFACTURING METHOD

This application is a divisional application U.S. patent application Ser. No. 10/423,893, filed Apr. 28, 2003 now U.S. Pat. No. 6,785,583.

FIELD OF THE INVENTION

The present invention relates to a management system and management method for managing an industrial device and, more particularly, to a semiconductor exposure apparatus and control method therefor.

BACKGROUND OF THE INVENTION

Circuit micropatterning and an increase in density require a projection exposure apparatus for manufacturing a semiconductor device to project a circuit pattern formed on a reticle surface onto a wafer surface at a higher resolving power. The circuit pattern projection resolving power depends on the NA (Numerical Aperture) of a projection optical system and the exposure wavelength. The resolving power is increased by increasing the NA of the projection optical system or shortening the exposure wavelength. As for the latter method, the exposure light source is shifting from g-line to i-line, and further from i-line to an excimer laser. With the excimer laser, exposure apparatuses having oscillation wavelengths of 248 nm and 193 nm are available.

At present, a VUV (Vacuum Ultra Violet) exposure method with a shorter oscillation wavelength of 157 nm and an EUV (Extreme Ultra Violet) exposure method with a wavelength around 13 nm are examined as candidates for next-generation exposure systems.

Along with circuit micropatterning, demands have also arisen for aligning at a high precision a reticle on which a circuit pattern is formed and a wafer onto which the circuit pattern is projected. The necessary precision is ⅓ the circuit line width. For example, the necessary precision in a current 180-nm design rule is ⅓, i.e., 60 nm.

Various device structures have been proposed and examined for commercial use. With the spread of personal computers and the like, micropatterning has shifted from memories such as a DRAM to CPU chips. For further IT revolution, circuits will be further micropatterned by the development of MMIC (Millimeter-wave Monolithic Integrated Circuits) and the like used in communication system devices called a home wireless LAN and Bluetooth, highway traffic systems (ITS: Intelligent Transport Systems) represented by a car radar using a frequency of 77 GHz, and wireless access system LMDSs (Local Multipoint Distribution Services) using a frequency of 24 to 38 GHz.

There are also proposed various semiconductor device manufacturing processes. As a planarization technique which solves an insufficient depth of the exposure apparatus, the W-CMP (Tungsten Chemical Mechanical Polishing) process has already been known as a past technique. Instead, a Cu dual damascene process has received a great deal of attention.

Various semiconductor device structures and materials are used. For example, there are proposed a P-HEMT (Pseudomorphic High Electron Mobility Transistor) and M-HEMT (Metamorphe-HEMT) which are formed by combining compounds such as GaAs and InP, and an HBT (Heterojunction Bipolar Transistor) using SiGe, SiGeC, and the like.

Under the present circumstance of the semiconductor industry, many apparatus variables (=parameters) must be set in correspondence with each exposure method and each product in the use of a semiconductor manufacturing apparatus such as an exposure apparatus. The number of parameters to be optimized is very large, and these parameters are not independent of each other but are closely related to each other.

These parameter values have conventionally been decided by trial and error by the person in charge of a device manufacturer. A long time is taken to decide optimal parameters. If, e.g., a process error occurs after the parameter values are decided, the parameter values of the manufacturing apparatus must be changed again along with a corresponding change in the manufacturing process. Also in this case, a long time is taken to set parameters.

Parameter values are decided as offsets from the results of an overlay inspection apparatus that are obtained by exposing several send-ahead wafers. Parameter values are optimized without considering the sensitivity to process variations.

In the semiconductor device production, the time which can be taken until the start of volume production after the activation of a manufacturing apparatus is limited. The time which can be taken to decide each parameter value is also limited. In terms of CoO (Cost of Ownership), the operating time of the manufacturing apparatus must be prolonged. To change a parameter value which has already been decided, it must be quickly changed.

In this situation, it is very difficult to manufacture various semiconductor devices with optimal parameter values. Even a manufacturing apparatus which can originally achieve a high yield can only exhibit a low yield because the apparatus is used without optimizing parameter values, resulting in a potential decrease in yield. Such a decrease in yield leads to a high manufacturing cost, a small shipping amount, and weak competitiveness.

SUMMARY OF THE INVENTION

The present invention has been made to overcome the conventional drawbacks, and has as its illustrative object to decide whether a predetermined parameter value set in an industrial device is optimal during volume production by the industrial device, and optimize the parameter value of the industrial device.

According to the present invention, the foregoing object is attained by providing an industrial device management system comprising:

an industrial device which operates in accordance with a parameter;

obtaining means for obtaining evaluation values of operation results of the industrial device corresponding to a plurality of parameter values of the parameter;

holding means for holding the evaluation values obtained by the obtaining means for each object to be processed by the industrial device; and optimization means for analyzing the evaluation values held by the holding means, and optimizing the parameter on the basis of at least one of sensitivity representing a change degree of the evaluation values upon the change in the parameter, and a variation amount of the evaluation values for each object to be processed.

According to another aspect of the present invention, the foregoing object is attained by providing a management method of managing a parameter for an industrial device which operates in accordance with a parameter, comprising:

an obtaining step of obtaining evaluation values of operation results of the industrial device corresponding to a plurality of parameter values of the parameter;

a holding step of holding the evaluation value obtained in the obtaining step for each object to be processed by the industrial device; and an optimization step of analyzing the evaluation values held in the holding step, and optimizing the parameter on the basis of at least one of sensitivity representing a change degree of the evaluation value upon the change in the parameter value, and a variation amount of the evaluation values for each object to be processed.

In still another aspect of the present invention, the foregoing object is attained by providing a management apparatus for managing an industrial device, comprising:

communication means for communicating with the industrial device which operates in accordance with a parameter;

obtaining means for obtaining evaluation values of operation results of the industrial device corresponding to a plurality of parameter values of the parameter;

holding means for holding the evaluation values obtained by the obtaining means for each object to be processed by the industrial device; and optimization means for analyzing the evaluation values held by the holding means, and optimizing the parameter on the basis of at least one of sensitivity representing a change degree of the evaluation value upon the change in the parameter, and a variation amount of the evaluation values for each object to be processed.

In still another aspect of the present invention, the foregoing object is attained by providing an industrial device management method using an apparatus connected via communication means to an industrial device which operates in accordance with a parameter, comprising:

an obtaining step of obtaining evaluation values of operation results of the industrial device corresponding to a plurality of the parameter values of the parameter;

a holding step of holding an estimation result of the evaluation value obtained in the obtaining step for each object to be processed by the industrial device; and an optimization step of analyzing the evaluation values held in the holding step, and optimizing the parameter on the basis of at least one of sensitivity representing a change degree of the evaluation values upon the change in the parameter, and a variation amount of the evaluation values for each object to be processed.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 2A is a flow chart when the present invention is applied to optimization of the alignment parameter value of the semiconductor exposure apparatus;

FIG. 2C is a view for explaining processing of storing a measurement result and an estimation result in a database according to the embodiment;

FIGS. 6A and 6B are graphs for explaining another example (extreme) of optimizing a parameter value according to the embodiment;

FIG. 10 is a flow chart for explaining the flow of a device manufacturing process;

FIG. 14A is a view showing an alignment mark 14;

FIG. 14B is a sectional view showing the sectional structure of the alignment mark 14;

DETAILED DESCRIPTION OF THE PREFERRED EMBODIMENT

A preferred embodiment of the present invention will now be described in detail in accordance with the accompanying drawings.

An embodiment in which the present invention is applied to alignment of an exposure apparatus will be described in detail with reference to FIGS. 1 and 2. In the following description, of a management system according to the embodiment, an alignment variable optimization system which corresponds to a volume production apparatus and is applied to the alignment system of an exposure apparatus will be called OAP (Optimization for Alignment Parameter in volume production). Parameter values in this specification include numerical parameter values which represent numerical values, and values representing setting states such as setting parameter choice data for selecting a sample shot layout or an alignment method. Variables also include apparatus variation elements such as a choice, and generation conditions, in addition to numerical values.

Figure 1:
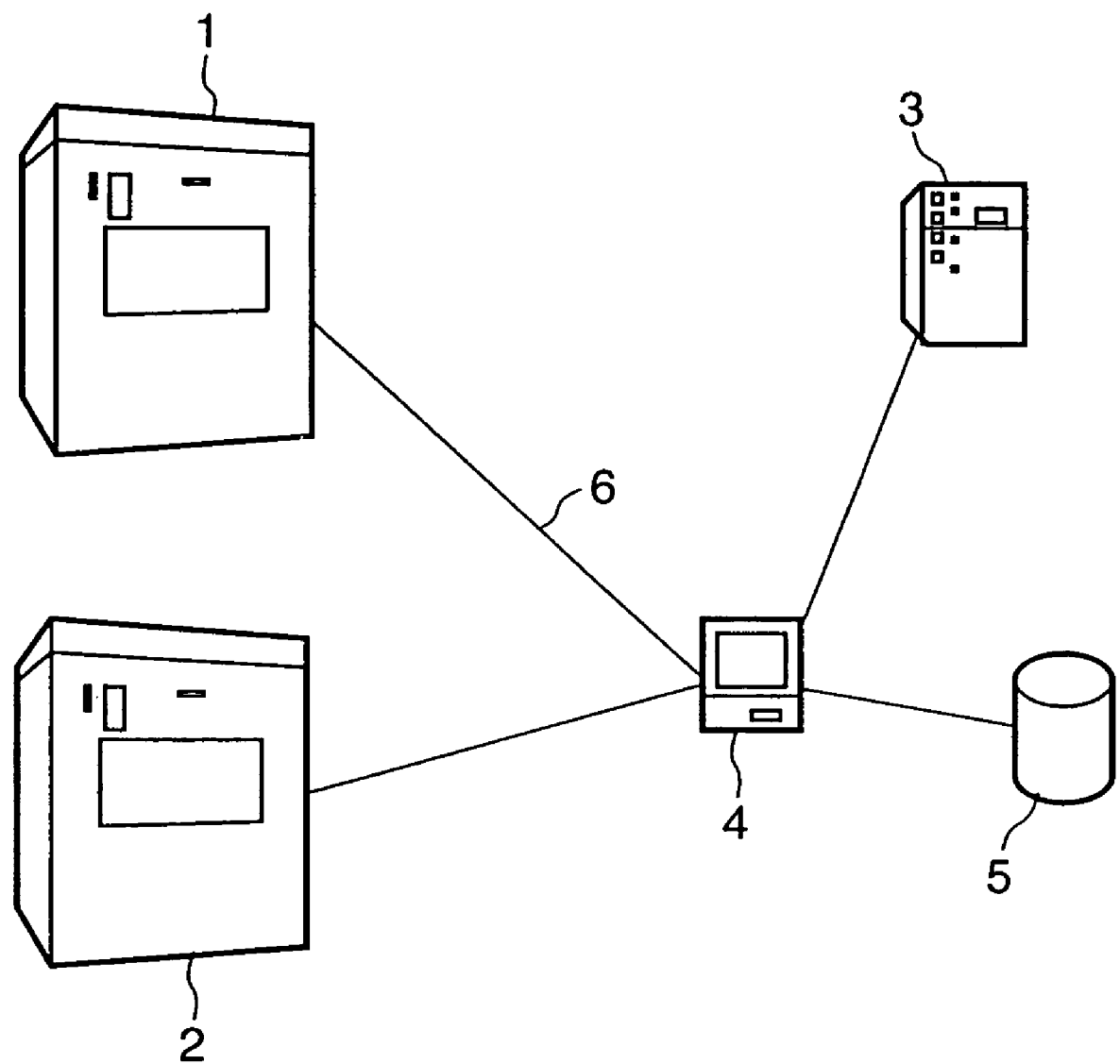
FIG. 1 is a view showing an apparatus arrangement according to an embodiment when the present invention is applied to optimization of the alignment parameter value of a semiconductor exposure apparatus.

FIG. 1 is a view showing the schematic arrangement of an exposure management system for implementing the OAP system according to the embodiment. In FIG. 1, reference numerals 1 and 2 denote exposure apparatuses which expose an object such as a wafer to a reticle pattern; 3, an overlay inspection apparatus which inspects misalignment of the exposure position of a pattern on a wafer which is exposed by the exposure apparatuses 1 and 2 and then developed; 4, a central processing unit (PC/WS) which includes a personal computer or workstation; and 5, a database which stores a database of various measurement results (alignment measurement results and the like) by the exposure apparatuses 1 and 2, alignment signal processing results, and inspection results by the overlay inspection apparatus 3.

A plurality of exposure apparatuses (1 and 2 in FIG. 1), the PC/WS 4 (to be referred to as the PC 4 hereinafter) which accesses the database 5 to realize OAP according to the embodiment, and the overlay inspection apparatus 3 which inspects an alignment result are connected by, e.g., an in-house LAN 6.

Figure 12:
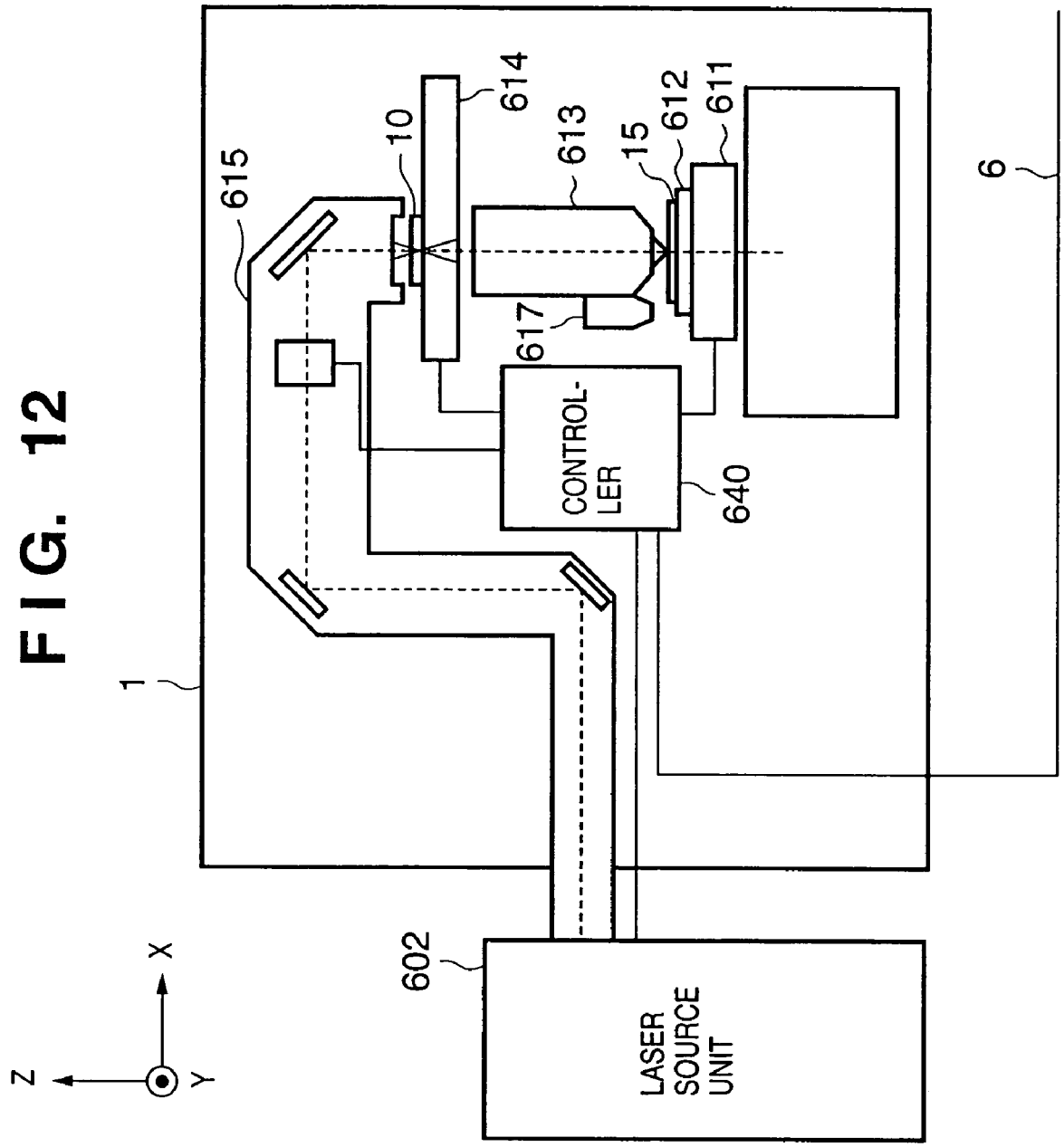
FIG. 12 is a view for explaining the whole arrangement of an exposure apparatus subjected to industrial device management according to the embodiment of the present invention.

Details of the exposure apparatus 1 will be explained with reference to FIG. 12. FIG. 12 is a view for explaining the whole arrangement of the exposure apparatus 1 in FIG. 1. The exposure apparatus 1 exposes a wafer 20 to the pattern of a reticle 10.

In FIG. 12, reference numeral 602 denotes a laser source. An emitted laser beam serving as exposure light is shaped by an illumination optical system 615, and irradiates the pattern of the reticle 10.

The reticle 10 is held on a stage 614 which can move in a reticle scanning direction within the x-y plane in FIG. 12. Reference numeral 613 denotes a projection system having a predetermined reduction magnification. The pattern of the reticle 10 illuminated via the illumination optical system 615 is projected onto one shot region of the wafer 20 via the projection system 613, and the wafer 20 is exposed to the pattern. The wafer 20 is coated with a resist (photosensitive agent), and a latent image is formed by exposure. The wafer 20 is set on a wafer stage 611 via a wafer chuck 612. Reference numeral 617 denotes an alignment optical system which can detect an alignment mark 14 formed on the wafer 20, as shown in FIGS. 14A and 14B.

The wafer stage 611 can move the set wafer 20 within the stage plane (x- and y-axis directions), in the vertical direction (z-axis direction), and in tilt and rotation directions around the respective axes, controlling positioning. By z-axis positioning of the wafer stage 611, the projection system 613 is focused on the wafer 20.

Note that movement and positioning control of the reticle stage 614 and wafer stage 611 are based on position information obtained by measuring information on the stage position and posture by a sensor (not shown).

The reticle stage 614 and wafer stage 611 are connected to a controller 640, and exchange data in real time for sync control. The laser source 602 is also connected to the controller 640, and control of the emission timing and control synchronized with movement of the stages 614 and 611 can be achieved. The controller 640 is connected to the LAN 6.

Figure 13:
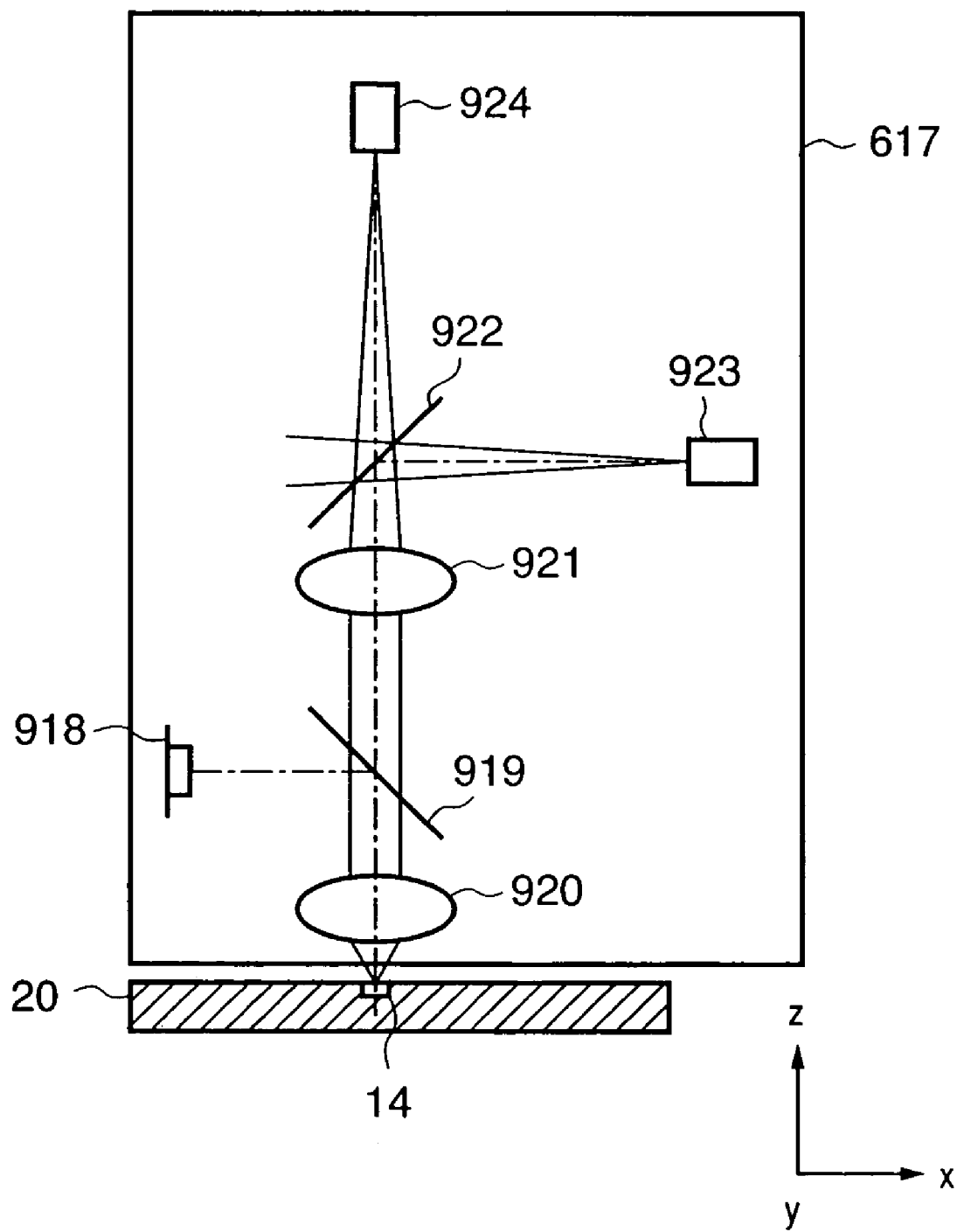
FIG. 13 is a block diagram showing the main building components of an alignment unit 617.

The principle of measuring the position of an alignment mark by an alignment optical system will be explained with reference to FIG. 13. FIG. 13 is a block diagram showing the main building components of the alignment optical system 617. Illumination light from a light source 918 is reflected by a beam splitter 919, passes through a lens 920, and illuminates the alignment mark 14 on the wafer 20. Diffracted light from the alignment mark 14 passes through the lens 920, the beam splitter 919, and a lens 921, is split by a beam splitter 922, and received by CCD sensors 923 and 924. The alignment mark 14 is enlarged by the lenses 920 and 921 at an imaging magnification of about 100, and forms images on the CCD sensors 923 and 924. The CCD sensors 923 and 924 measure the X and Y positions of the alignment mark 14, respectively. One sensor is rotated through 90° around the optical axis with respect to the other sensor.

The measurement principle is the same between the X and Y directions, and X position measurement will be described. The position measurement alignment mark 14 will be explained. As shown in FIG. 14A, the alignment mark 14 in the embodiment is comprised of a plurality of (in FIG. 14A, four) stripe-shaped position detection marks (to be also referred to as "elements" of the alignment mark) 32 which are 4 μm in the alignment measurement direction (X direction) and 30 μm in the non-measurement direction (Y direction) and are arrayed in the X direction at a preset interval (L=20 μm) As shown in FIG. 14B, the sectional structure of each element 32 is recessed by etching, and the element 32 is coated with a resist (not shown).

Figure 15:
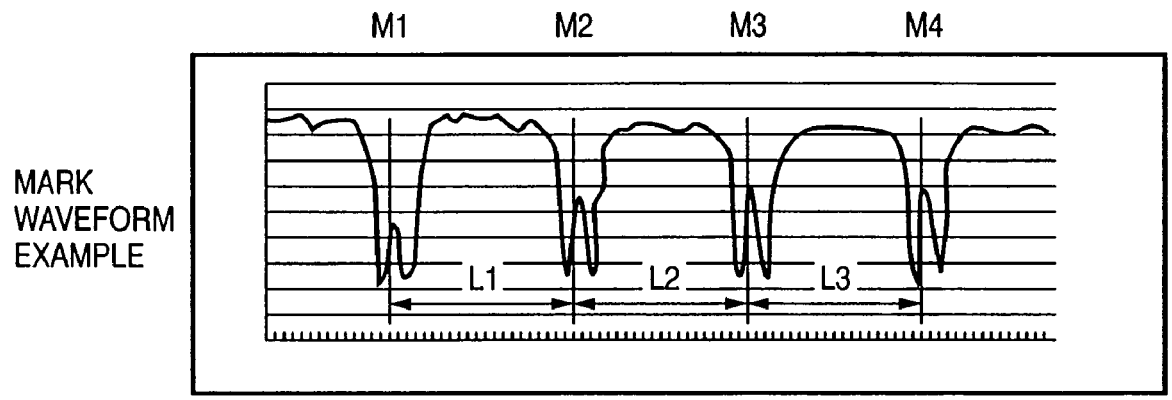
FIG. 15 is a chart showing an alignment signal.

FIG. 15 shows an alignment signal attained by receiving, by the CCD sensors 923 and 924, reflected light obtained by irradiating a plurality of position detection marks 32 with illumination light and photoelectrically converting light. Four mark signals shown in FIG. 15 undergo proper signal processing, and their element positions (M1, M2, M3, and M4 in an order from the left in FIG. 15) are detected. The intervals between these elements (L1, L2, and L3 in an order from the left in FIG. 15) will be called "mark element intervals".

FIG. 2A is a flow chart for explaining the processing outline of OAP according to the embodiment. Assume that a wafer to be exposed is loaded into the exposure apparatus 1, and a corresponding reticle is set in the exposure apparatus 1 (not shown in FIG. 2A). Global alignment called AGA (Advanced Global Alignment) is executed with a parameter value set for an operation job (parameter value used in alignment for actually performing exposure). A wafer magnification, wafer rotation, and shift amount (all of which will be called AGA data) at this time are obtained (process 11). "AGA" is global alignment for measuring a wafer position depending on the precision of an X-Y stage equipped with a laser interferometer. In AGA, the wafer magnification, wafer rotation, and shift amount of a wafer are obtained, and statistical processing such as removal of an abnormal value is executed. "Global Alignment" is an alignment system of moving a wafer stage to an exposure position on the basis of estimation calculation using position information. AGA measurement results which are measured and calculated in process 11 are transferred as values by data transfer 18 to the PC 4 which controls OAP. Examples of the parameter value are the line width of an alignment mark, the illumination mode (center wavelength, wavelength width, and σ) of an alignment optical system, the layout or number of sample shots used for AGA (shots used to actually measure a position on a wafer), and a combination of them.

The stage is driven again by using stage driving information (log). AGA measurement is performed using a parameter value other than that for the operation job (e.g., the number of sample shots which is set as an operation job parameter value and used for AGA is changed to another value). A wafer magnification, wafer rotation, and shift amount are obtained (process 12). These AGA data are also transferred as values to the PC 4 which controls OAP, similar to the AGA data obtained with the previous parameter value set for the job (data transfer 18).

In data transfer 18, these AGA data and all signals (alignment signals) concerning an alignment mark detected in AGA are transferred to the PC 4. A system which transfers an alignment signal to the PC 4 is called ADUL (Alignment Data Up Load).

After all data are obtained in process 12, the exposure apparatus 1 performs exposure on the basis of AGA results with a set of parameter values for the operation job (process 13). Processes 11 to 13 are executed in the exposure apparatuses 1 and 2. An exposed wafer is developed by a developing apparatus, and supplied to the overlay inspection apparatus 3 to measure the alignment result (process 14). The inspection result by the overlay inspection apparatus 3 is transferred to the PC 4 (data transfer 19).

The PC 4 which has received the AGA data, alignment signals, and the like from the exposure apparatus by data transfer 18 stores in the database 5 the received AGA data containing the wafer magnification, wafer rotation, and shift amount (process 15). The PC 4 performs another signal processing (corresponding to a change in parameter value) for the alignment signal detected in AGA. The PC 4 estimates pseudo AGA measurement results, i.e., a wafer magnification, wafer rotation, and shift amount, and stores them in the database (process 15). Another signal processing includes a change in processing window width which restricts the signal range for use. The inspection result by the overlay inspection apparatus 3 is also transferred to the PC 4 (data transfer 19), and registered in the database in correspondence with the AGA data that have already been stored in the database (process 15).

OAP processing will be explained with reference to FIG. 2C. The PC 4 stores, for each job parameter, AGA data and an alignment signal that are received by data transfer 18, and also stores an inspection result received by data transfer 19 (note that the inspection result is common to all job parameters). For example, as represented by 201 in FIG. 2C, data are stored for job parameter (1), (2), . . . . For example, job parameters are (1) the mark line width, (2) the illumination mode, (3) the layout of sample shots used for AGA, and (4) the processing window width.

In FIG. 2C, 202 represents a data storage state for one job parameter. AGA data, an alignment signal, and an inspection result are stored for each wafer. As described above, a pseudo AGA measurement result is stored as an AGA estimation. In this example, a change in AGA data (e.g., a shift amount) upon successively changing a predetermined parameter a used for signal processing is estimated, and the result (204 in FIG. 2C) is stored. An inspection result, i.e., a change in overlay error when exposure is executed with the changed parameter value is estimated from these data, and the result (205 in FIG. 2C) is stored. Estimation of the inspection result will be described later.

AGA measurement values and the inspection result of the overlay inspection apparatus are acquired for a plurality of wafers, and whether a combination of the current job setting parameter values is optimal is decided (process 16). "Optimal" decision will be described below. If another combination of optimal parameter values exists as a result of the decision, the combination of optimal parameter values is reflected as job setting parameter values in the exposure apparatuses 1 and 2 in exposure of lots subsequent to the current lot (process 17 and data transfer 20).

By repeating the above processing, a combination of parameters is optimized and can be used for subsequent lots even upon process variations.

The use of the OAP system according to the embodiment can optimize parameters without examining a special wafer in addition to volume production. The effective performance of the exposure apparatus can be improved without decreasing the productivity in volume production.

Figure 16C:
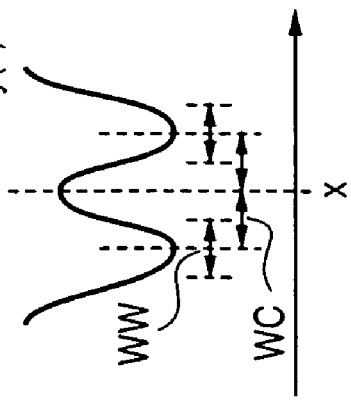
FIG. 16C is an enlarged view showing part of the alignment signal in FIG. 15.
Figure 16B:
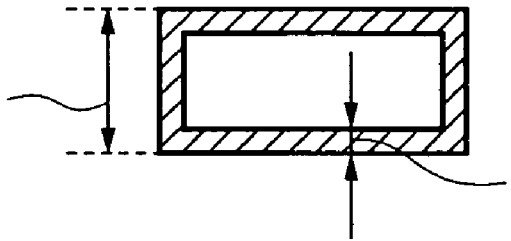
FIG. 16B is a schematic plan view showing a mark element 32.
Figure 16A:
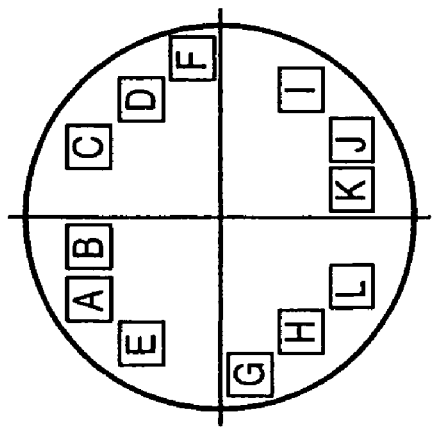
FIG. 16A is a schematic view showing an AGA sample shot layout on a wafer 20.

Parameters to be optimized in OAP described above include a global alignment sample shot layout considering a combination of shot A to shot L, as shown in FIG. 16A. FIG. 16A is a schematic view showing an example of an AGA sample shot layout on the wafer 20.

The parameters also include the width and line width of the mark element 32. The mark element 32 of the alignment mark 14 shown in FIGS. 14A and 14B is recessed, but a recent process adopts a mark element 32 whose outline only is recessed, in order to eliminate any recess on the wafer surface. For this reason, as shown in FIG. 16B, a mark width ML as the length of the mark element 32 in the alignment measurement direction, and a mark line width MLW as the outline width of the mark element 32 can be alignment parameters. FIG. 16B is a schematic plan view showing the mark element 32.

Further, the parameters include an effective signal processing window width which restricts the signal band used in alignment signal processing, as described above. FIG. 16C is an enlarged view showing a portion M1 of the alignment signal in FIG. 15. The alignment signal is processed to obtain alignment results such as the wafer magnification, wafer rotation amount, and shift amount. If an effective signal processing window width WW representing a portion obtained as an effective signal, or a distance (processing window center distance) WC between the center of the window and the center of the alignment signal is changed, the obtained wafer magnification, wafer rotation amount, and shift amount are also changed. Hence, the signal processing window width WW and signal processing window center distance WC can also be parameters.

OAP processing can be briefly expressed as follows. OAP according to the embodiment is a "feed forward" system. That is, AGA data and alignment signals are acquired in both a case wherein a plurality of or one predetermined job parameter value is set to a parameter value for obtaining AGA data actually used for alignment and a case wherein a plurality of or one predetermined job parameter value is set to another parameter value. The AGA data are compared with inspection results by the overlay inspection apparatus, and a more proper parameter value is acquired and can be used for subsequent lots.

"Feed forward" and opposite "feedback" described in this specification will be defined.

"Feedback" is so-called preprocessing. In "feedback", several send-ahead wafers are supplied before a lot, and subjected to alignment and exposure to obtain an offset by the overlay inspection apparatus. The result is input as an offset value to the exposure apparatus. The exposure apparatus uses the offset value to process the remaining wafers in the lot.

In "feed forward", no send-ahead wafer is used from the current lot, but the results of the preceding lot are used by various numerical processes. "Feed forward" is proposed in consideration of the situation in which the use of an expensive exposure apparatus with a long Up Time is superior to preprocessing in terms of CoO. "Feed forward" can be effectively applied to volume production on the premise that currently set parameter values are almost optimal.

Figure 9:
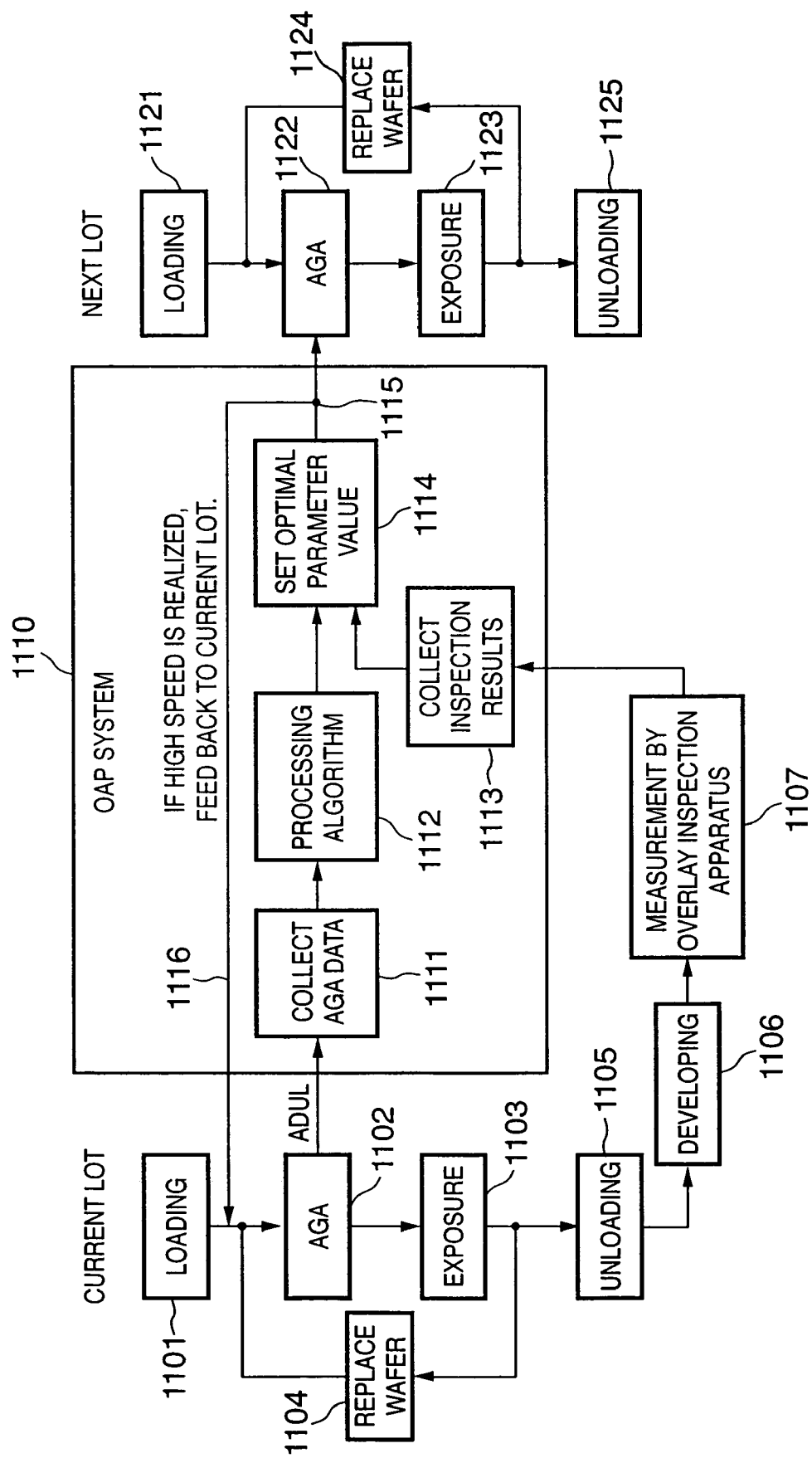
FIG. 9 is a block diagram for explaining feed forward processing and feedback processing according to the embodiment.

FIG. 9 is a block diagram showing feed forward of an optimal parameter by the OAP system according to the embodiment.

Reference numerals 1101 to 1105 denote processes for the current lot in the exposure apparatus 1; and 1121 to 1125, processes for the next lot in the exposure apparatus 1. In process 1101, wafers are loaded for each lot. In process 1102, AGA measurement is performed for a wafer which is extracted from the loaded lot and subjected to exposure, obtaining AGA data (wafer magnification, wafer rotation, and shift amount). In process 1103, the wafer undergoes exposure processing while the reticle and wafer are aligned using the AGA data. The exposure apparatus unloads the exposed wafer (1105), and if an unprocessed wafer exists in the lot, repeats AGA measurement and exposure processing for the next wafer (1104).

As described above, AGA measurement (1102) is executed with a job parameter and another parameter. An OAP system 1110 is notified of the obtained alignment signal and AGA data (in this example, the PC 4 is notified of them).

The exposed wafer unloaded from the exposure apparatus 1 is developed by a developing apparatus (not shown) (1106), and inspected by the overlay inspection apparatus (1107). The measurement result by the overlay inspection apparatus is sent to the PC 4.

The OAP system 1110 collects AGA measurement results (AGA data and alignment signals) from the exposure apparatus by AGA data collection (1111), and stores them in the database 5. Based on the collected AGA data and alignment signals, a processing algorithm (1112) estimates AGA data when various parameter values are successively changed. The estimation results are stored in the database 5. In inspection data collection (1113), the inspection results of measurement (1107) by the overlay inspection apparatus are collected and stored in the database 5. In this manner, AGA measurement results and inspection results are collected and stored in the database 5 for a single wafer. These data are stored for each wafer in correspondence with the wafer ID.

In optimal parameter value setting (1114), overlay inspection results upon changing various parameter values are estimated on the basis of the actually measured and estimated AGA data and measurement results by the overlay inspection apparatus 3. Optimal parameter values are set based on the estimation results.

The optimal parameter values set in optimal parameter value setting 1115 are used as AGA measurement parameter values for each wafer of the next lot (feed forward 1115). That is, the exposure apparatus executes processes 1121 to 1125 (identical to processes 1101 to 1105) for the next lot. In this AGA measurement, parameter values set by optimal parameter value setting (1114) are employed.

In FIG. 9, reference numeral 1116 denotes feedback to be described later.

Figure 2B:
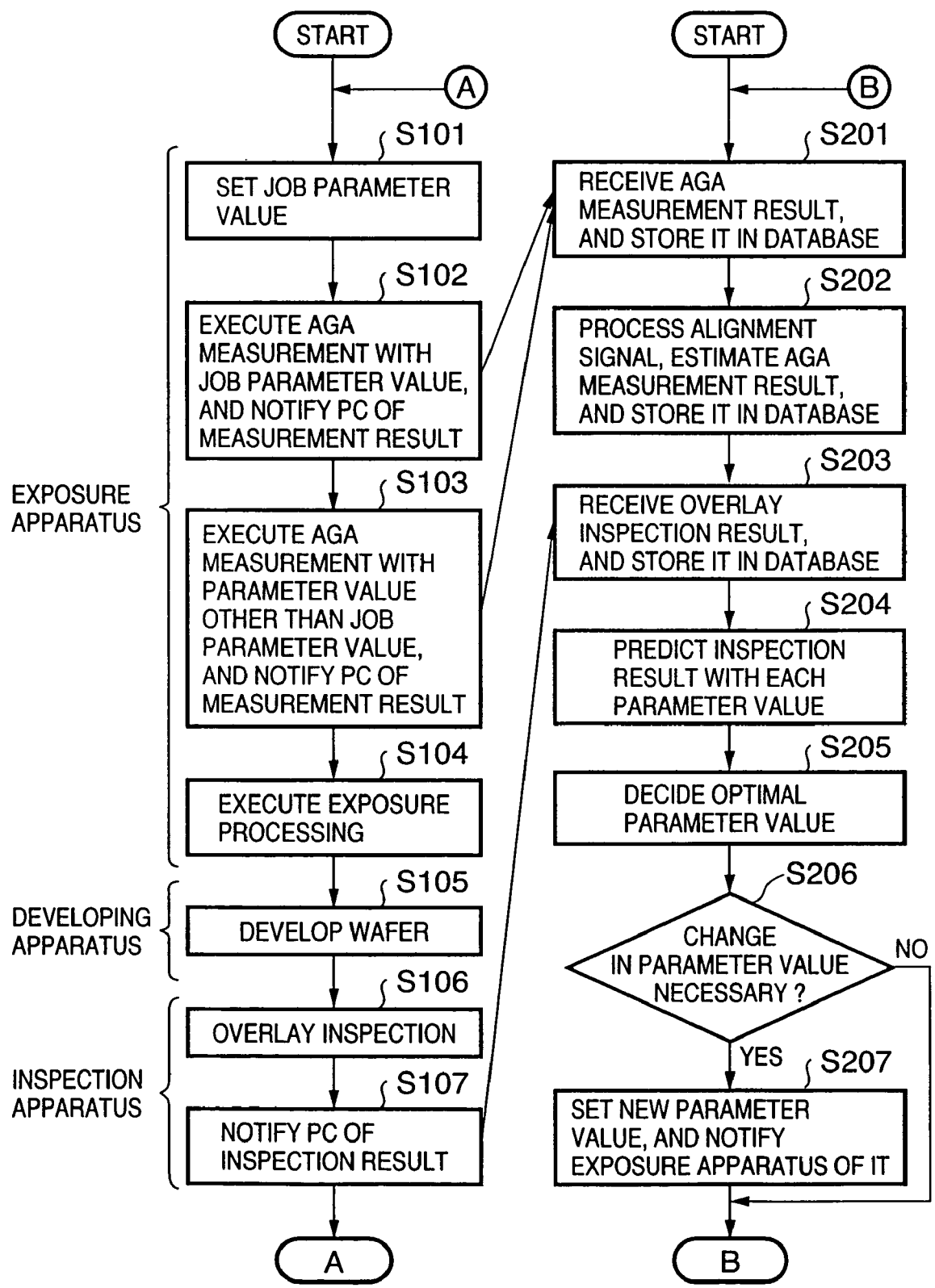
FIG. 2B is a flow chart for explaining processing of an OAP system according to the embodiment.

OAP processing shown in FIGS. 2A, 2C, and 9 will be explained in more detail with reference to the flow chart of FIG. 2B.

As represented by processes 11 and 18, the exposure apparatus 1 sets job parameter values, performs AGA measurement with the set job parameter values, and notifies the PC 4 of the measurement results (AGA data and an alignment signal) (steps S101 and S102). As represented by processes 12 and 18, the exposure apparatus 1 performs AGA measurement with a set parameter value other than the previously set job parameter values, and notifies the PC 4 of the measurement results (step S103).

As represented by process 13, the exposure apparatus 1 performs exposure processing for the wafer by using AGA data measured by the job parameter values (step S104). The exposed wafer is unloaded from the exposure apparatus 1, developed (step S105), and transferred to the overlay inspection apparatus 3. As represented by process 14 and data transfer 19, the overlay inspection apparatus executes overlay inspection for the transferred wafer (step S106), and notifies the PC 4 of the inspection result (step S107).

As represented by process 15, the PC 4 stores in the database 5 the AGA data and alignment signals transferred from the exposure apparatus in steps S102 and S103 (step S201: 202a and 202b in FIG. 2C). The PC 4 performs, for each transferred alignment signal, signal processing (e.g., performs signal processing while successively changing the signal processing range (window) within a given range). The PC 4 estimates an alignment measurement result upon changing the parameter value within a given range, and stores the estimation result (AGA estimation value) in the database 5 (step S202: 202d in FIG. 2C). The PC 4 receives the measurement result transmitted from the overlay inspection apparatus 3 in step S107, and stores it in the database 5 (step S203: 202c in FIG. 2C). By these processes, AGA data, an alignment signal, and an AGA estimation value represented by 202 in FIG. 2C are stored in correspondence with a job parameter value and a wafer ID 202f. Note that the wafer ID is transferred from the exposure apparatus together with AGA data and alignment signals in steps S102 and S103. Also, in step S107, the wafer ID is transferred from the overlay inspection apparatus 3 together with an inspection result.

A predicted measurement value by the overlay inspection apparatus upon successively changing the parameter within a given range is calculated and acquired using data stored in steps S201 to S203 (step S204). The acquired value is stored as an inspection result estimation value 202e in table 202 of FIG. 2C in correspondence with the job parameter set and wafer ID. An optimal parameter is decided by using predicted measurement values acquired for a plurality of wafers (step S205). If the decided parameter is different from the currently used parameter, it is determined that the parameter must be changed, and the exposure apparatus is notified of the decided parameter (steps S206 and S207). That is, whether the current parameter setting is optimal is decided, and if the parameter must be changed, the changed parameter is reflected in subsequent lots (feed forward processing) (process 17 and data transfer 20).

Note that determination of whether to change the parameter in step S206 may be executed depending on whether the parameter falls outside the optimal parameter range to be described later.

Optimization of an alignment parameter in process 16 of FIG. 2A will be exemplified in detail by using one parameter. The parameter in the following example represents, e.g., "the number (layout) of sample shots used for AGA, illumination mode, mark line width, or processing window width" described above. A method of optimizing one parameter will be described, but the idea of this method can also be applied to optimization of a plurality of parameters. Optimization of an alignment parameter in the embodiment is "to select not a parameter with which the result by the overlay inspection apparatus is zero, but a parameter with which the sensitivity of the result by the overlay inspection apparatus and variations between wafers become minimum (extremes).

Figure 3:
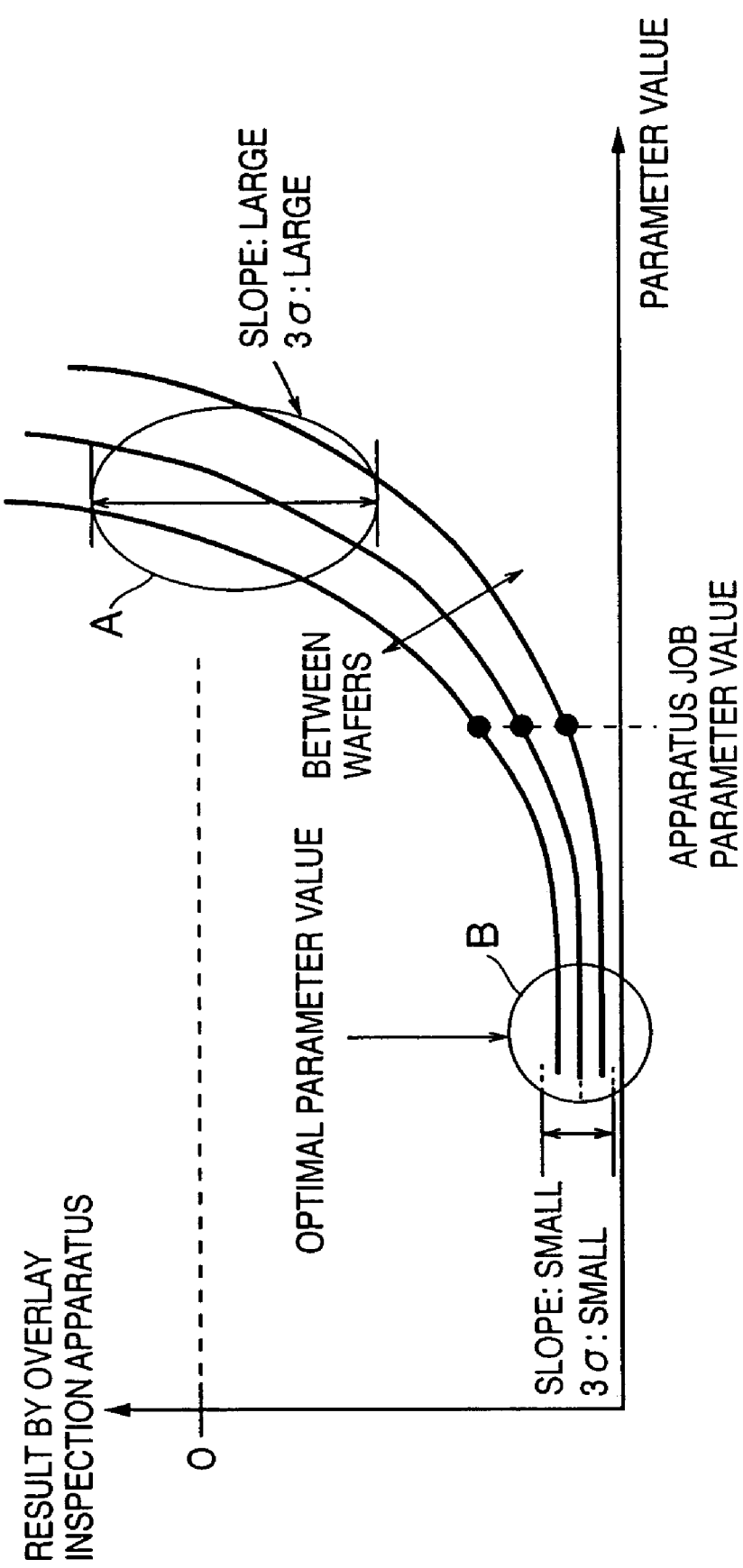
FIG. 3 is a graph showing results (inverted convex) by an overlay inspection apparatus that are plotted as a function of one parameter value according to the embodiment.
Figure 4:
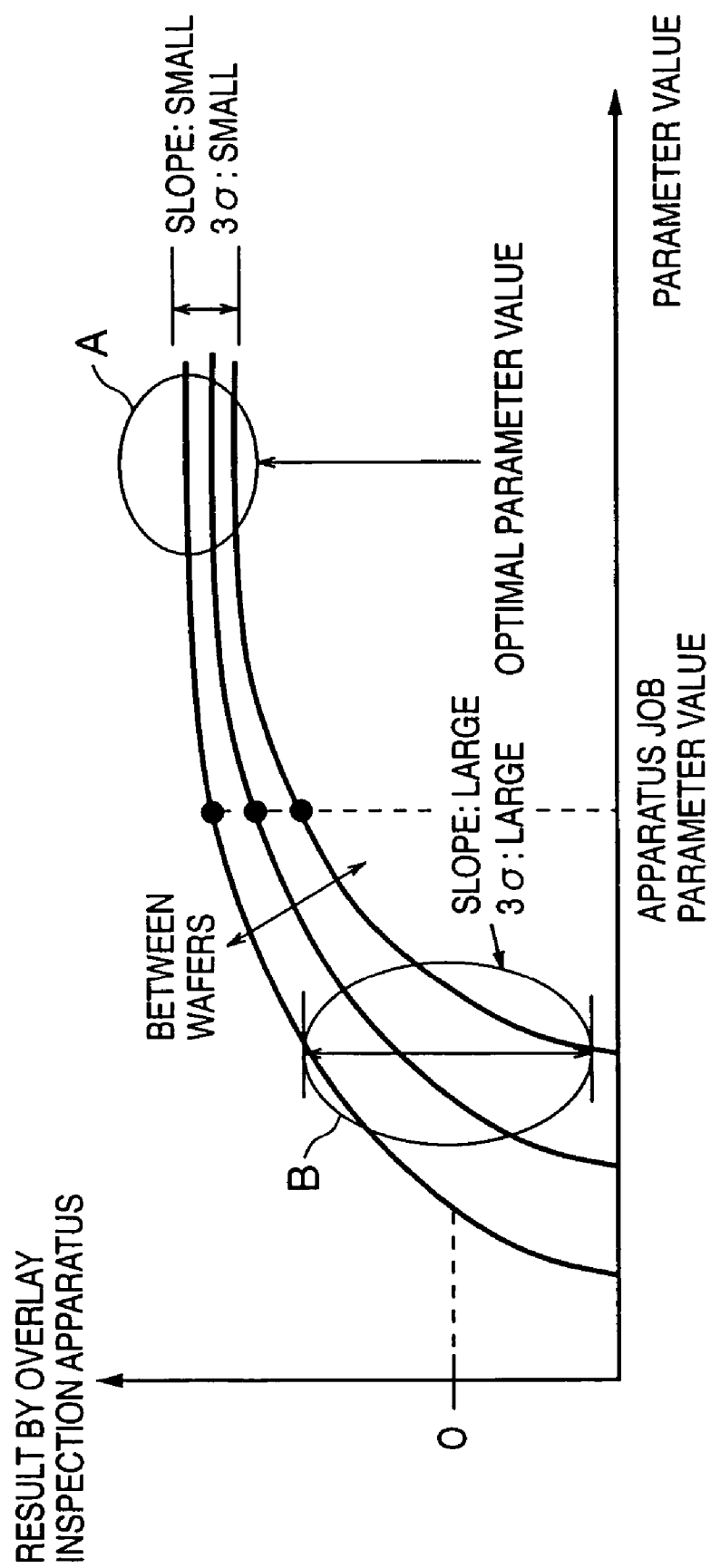
FIG. 4 is a graph showing results (convex) by the overlay inspection apparatus that are plotted as a function of one parameter value according to the present invention.

Parameter optimization will be described. FIGS. 3 and 4 are graphs showing the results of overlay inspection apparatus which are plotted for one parameter. These plotted curves will be briefly explained.

The overlay inspection apparatus obtains only one result with an apparatus job parameter value ● in FIGS. 3 and 4 for each wafer. However, a predicted measurement value by the overlay inspection apparatus can be calculated using an AGA measurement value actually measured with a parameter value (non-apparatus job parameter value) other than an apparatus job parameter value, an AGA measurement value (to be also referred to as a pseudo AGA measurement value hereinafter) pseudo-predicted by, e.g., changing alignment signal calculation processing, an AGA measurement result with an apparatus job parameter value, and an inspection result by the overlay inspection apparatus:

(predicted measurement value by overlay inspection apparatus with given parameter value)=(AGA measurement value with apparatus job parameter value)+(inspection value by overlay inspection apparatus)−(AGA measurement value or pseudo AGA measurement value with non-apparatus job parameter value).

Note that the non-apparatus job parameter value is attained by changing the sample shot layout, illumination mode, mark line width, or the like from the apparatus job parameter value. In alignment signal calculation processing, the alignment signal is processed to calculate a pseudo AGA measurement value while, e.g., the processing window width is successively changed.

"AGA measurement value with job parameter value" is a measurement result received in step S201, and corresponds to a point 207 in the graph shown in FIG. 2C. "Inspection result by overlay inspection apparatus" is acquired in step S203, and is a shift amount 206 from the AGA measurement value in the graph of FIG. 2C. In the above equation, (AGA measurement value with job parameter value)+(inspection result by overlay inspection apparatus) corresponds to a point 208 in the graph of FIG. 2C. "AGA measurement value or pseudo AGA measurement value with non-apparatus job parameter value" is the actually measured value/estimated value of an AGA measurement value upon successively changing a given parameter value, and corresponds to a curve 204 in FIG. 2C. This equation therefore provides the estimated value (curve 205 in FIG. 2C) of a measurement value by the overlay inspection apparatus.

In this way, predicted measurement values by the overlay inspection apparatus are calculated and plotted while the parameter is successively changed within a given range. This processing is executed for a plurality of (in this case, three) wafers, obtaining curves as shown in FIGS. 3 and 4. In this case, the result by the overlay inspection apparatus along the ordinate is, e.g., the offset (shift amount). However, the result is not limited to this, and may be the wafer magnification or wafer rotation.

Generally, in a region (low-sensitivity region) where the result by the inspection apparatus hardly varies with respect to changes in parameter value), the result by the inspection apparatus for each wafer also hardly varies. For example, when the prediction result by the overlay inspection apparatus is plotted with an inverted convex shape as a function of the parameter value, as shown in FIG. 3, an optimal parameter value exists in lower region B regardless of the resultant value by the overlay inspection apparatus. That is, even if the result by the overlay inspection apparatus is zero or almost zero in region A, as shown in FIG. 3, the result is stable against variations in a corresponding parameter value in region B where the sensitivity of the result by the inspection apparatus is low or variations between wafers are small. For this reason, an optimal parameter is set from region B.

When the prediction result by the overlay inspection apparatus is plotted with a convex shape as a function of the parameter value, as shown in FIG. 4, an optimal parameter value exists in upper region A regardless of the overlay inspection resultant value. That is, even if the parameter value in region B is predicted to make the result by the overlay inspection come close to zero, the parameter value in region A where the sensitivity of the result by the inspection apparatus is low or variations between wafers are small is set as an optimal parameter value. Accordingly, position measurement and alignment can be executed in a stable state hardly influenced by changes in parameter value over time and variations in wafer state. The shift between the AGA measurement value and an actual wafer position can be corrected by setting the exposure apparatus such that a misalignment value (e.g., result in region A by the overlay inspection apparatus) calculated from the graph is subtracted as an offset value unique to the apparatus from the AGA measurement value to perform position measurement and alignment.

An optimal parameter region used to determine whether to change the parameter value in step S206 is a region which has, e.g., an actual extreme as a center and is defined between upper and lower thresholds obtained by the empirical rule in advance or past data analysis. The thresholds may be defined for both the sensitivity and variations between wafers, or if they are correlated with each other, defined for only either of them. If the current parameter value falls outside the optimal parameter region, the parameter is optimized using a parameter value with which variations between wafers become smaller in the optimal parameter region.

In this embodiment, a prediction result as shown in FIG. 3 or 4 is obtained for each job parameter when inspection results are predicted for a plurality of types of parameter values. An optimal parameter value is obtained for each parameter and selected as a parameter value for use. This is effective particularly when the correlation between a plurality of types of parameters is weak.

The point of parameter optimization described above is "to select not a value with which the result by the overlay inspection apparatus is 0 but a value in a region where both or at least one of variations ($3\sigma$) between wafers in result by the overlay inspection apparatus with respect to the parameter and the sensitivity (slope) of the result by the overlay inspection apparatus with respect to changes in parameter value is substantially minimum". The sensitivity and variations between wafers are predicted to tend to increase/decrease at almost the same degree. In this case, a parameter value in a region where both variations between wafers and the sensitivity are regarded to be substantially minimum is selected. For example, if variations between wafers and the sensitivity are minimum in different regions, which region is selected is decided depending on the priority of the influence of variations in the optimal value of each job parameter and the influence of variations in status between wafers.

Figure 5A:
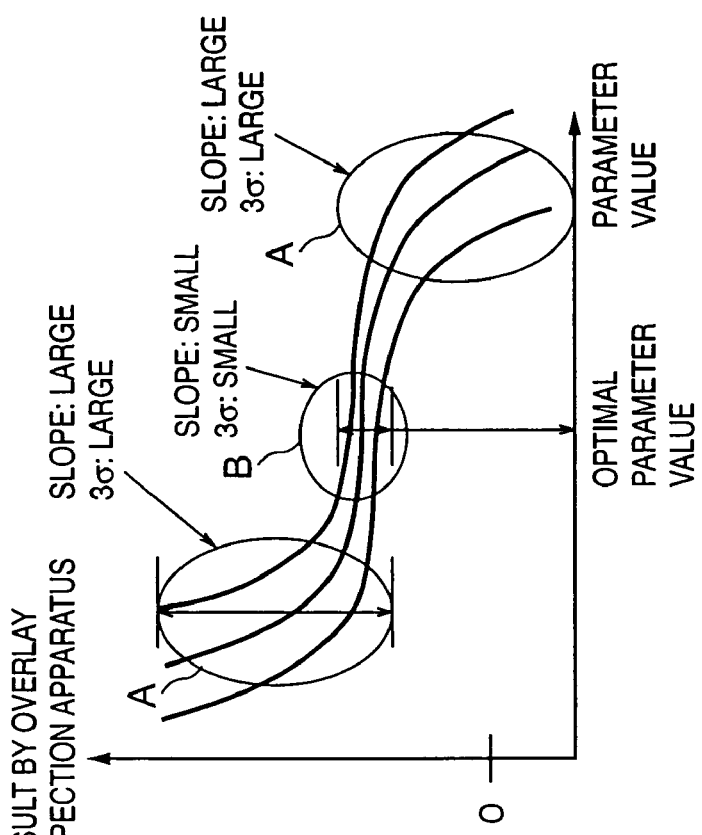
FIGS. 5A and 5B are graphs for explaining an example (inflection point) of optimizing a parameter value according to the embodiment.
Figure 5B:
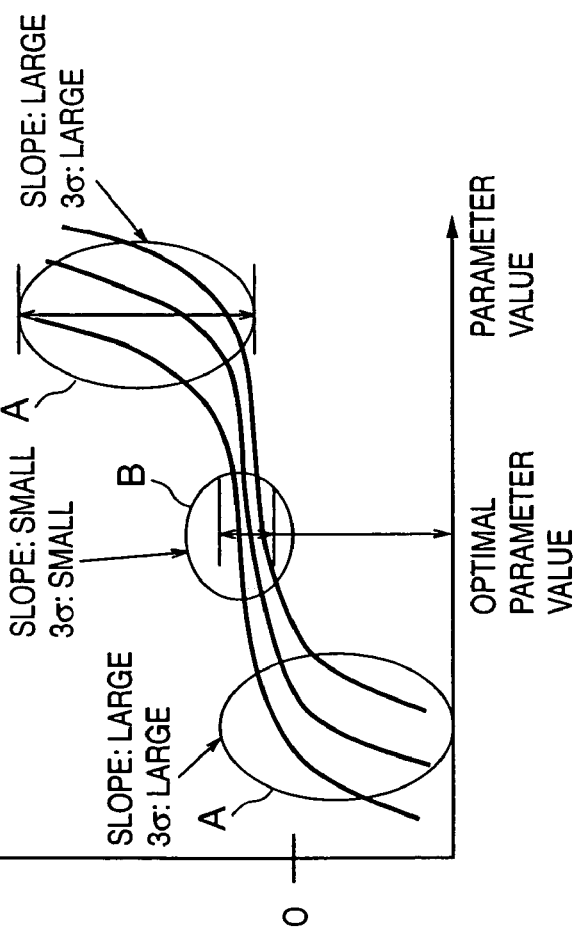

Several cases wherein the parameter value is optimized in the embodiment will be described with reference to FIGS. 5A, 5B, 6A, and 6B. FIGS. 5A, 5B, 6A, and 6B are graphs showing a case wherein the parameter value is optimized in region B rather than region A. The point at which the parameter value becomes optimal is an inflection point in shapes as shown in FIGS. 5A and 5B. A minimum value in an inverted convex shape as shown in FIG. 6A is a maximum value in a convex shape as shown in FIG. 6B.

A rare case wherein the parameter value is optimized in the embodiment (variations between wafers and the sensitivity become minimum in different regions) will be described.

Figure 7:
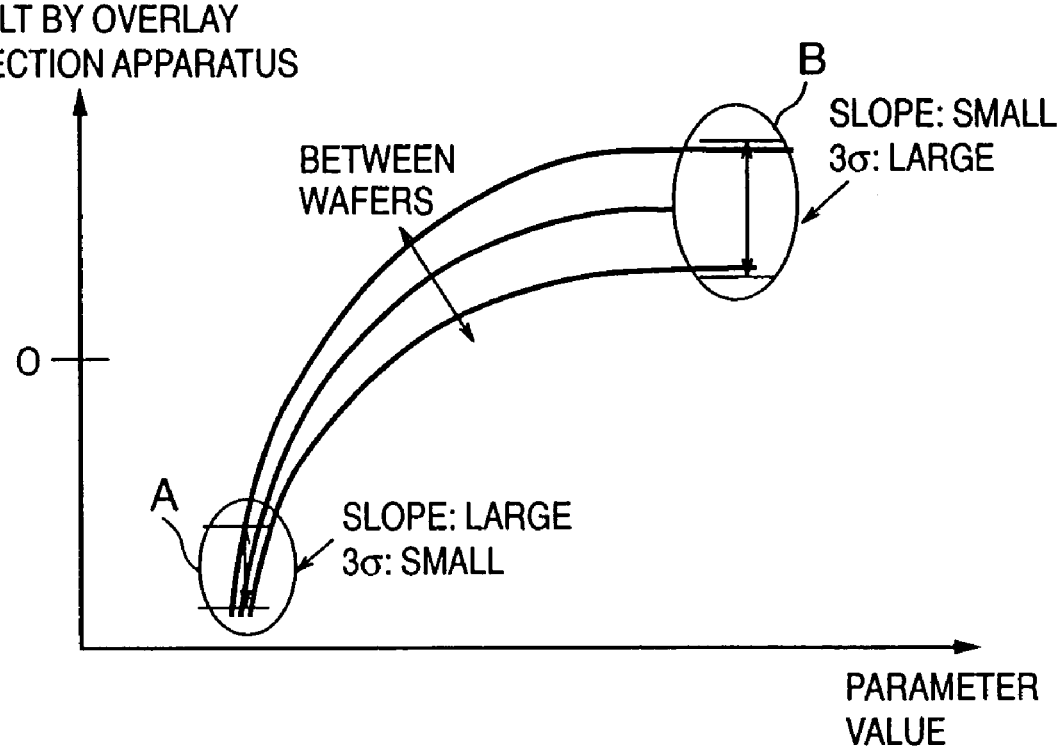
FIG. 7 is a graph for explaining still another example of optimizing a parameter value according to the embodiment.

In region A of FIG. 7, the sensitivity (slope) of the result by the overlay inspection apparatus with respect to changes in alignment parameter value is high, but variations between wafers are small. In region B of FIG. 7, the sensitivity of the result by the overlay inspection apparatus with respect to changes in alignment parameter value is low, but variations between wafers are large. If only one parameter can cope with such a case, either of regions A and B is selected. In this example, priority is given to "variations between wafers are small", and region A is selected.

In an environment where feedback of the parameter to the exposure apparatus can be controlled by wafer to wafer, optimization can be satisfactorily realized even if region B is selected as long as variations between successive wafers are small.

An example of optimizing two alignment parameter values will be explained by using the idea of OAP.

Figure 8:
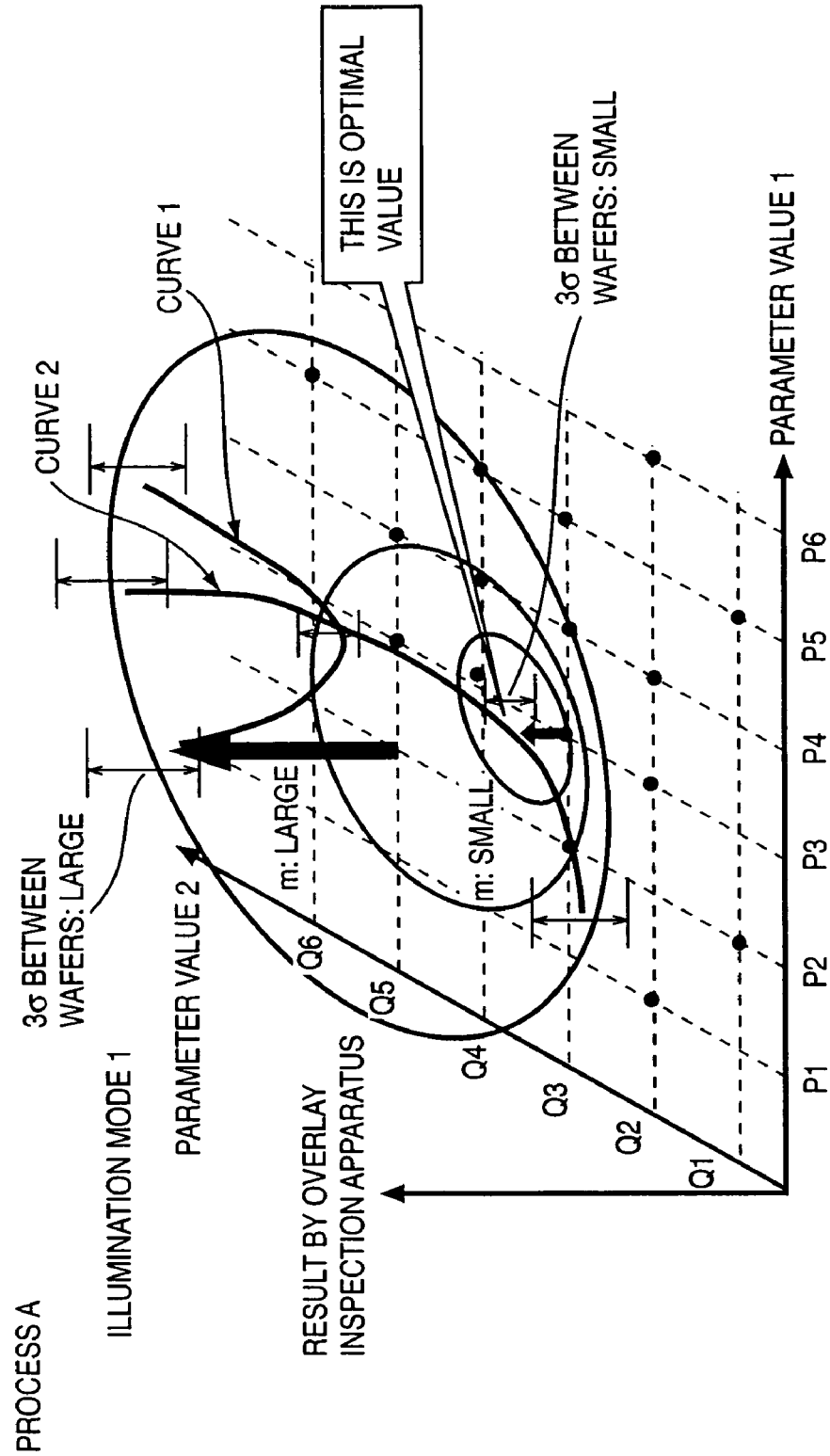
FIG. 8 is a graph three-dimensionally showing a method of optimizing two parameter values according to the embodiment.

FIG. 8 is a graph showing measurement values by the overlay inspection apparatus that are predicted and three-dimensionally plotted for a designated number of wafers while the parameter value of an illumination mode serving as a parameter is fixed to illumination mode 1 and the values of other parameters 1 and 2 are successively changed outside the apparatus in process A. Parameters 1 and 2 are, e.g., the processing window width and the distance between windows. The measurement value by the inspection apparatus is predicted while these parameter values are successively changed in the central processing unit PC 4. A combination of parameters 1 and 2 actually used for exposure in an apparatus job is (P2, Q5). In FIG. 8, variations between wafers in results by the overlay inspection apparatus in a given parameter combination are represented by the lengths of double-headed arrows at necessary portions, and the remaining results are not illustrated for descriptive convenience.

Assuming that curve 1 represents results by the overlay inspection apparatus upon changing P at Q=Q5, P=P3 at which variations between wafers are small is selected as an optimal parameter from curve 1. Assuming that curve 2 represents results by the overlay inspection apparatus upon changing Q at P=P3, Q=Q3 at which variations between wafers are small is selected as an optimal parameter from curve 2.

From this, it is revealed that "variations ($3\sigma$) between wafers in results by the overlay inspection apparatus become smallest in a combination (P3, Q3) of parameters 1 and 2". (P, Q)=(P3, Q3) is selected as optimal alignment parameters to be fed forward to the next lot. Note that search for an optimal value is not limited to this. It is also possible to, e.g., actually plot a region where the value is small and obtain a combination of optimal parameter values from the region. Decision of an optimal value by three-dimensionally estimating an inspection result is effective especially when the correlation between parameters 1 and 2 is high.

In the above-described embodiment, OAP is applied to "feed forward" to the next lot. OAP in this embodiment is also adopted as a system for "feedback" to the current lot, as represented by 1116 in FIG. 9, as long as "wafer to wafer" control is possible by a high-speed OAP system.

The outline of the above-described embodiment is as follows. That is, in the industrial device management system of the embodiment, the industrial device operates with a parameter value set for an operation job (apparatus job) and another parameter value, and acquires respective "measurement results". The inspection apparatus inspects the result of operating the industrial device with the operation job parameter value, and acquires an "inspection result". Which parameter is optimal is decided on the basis of the obtained "measurement results" and "inspection result". A variable in a region where both or at least one of the sensitivity (slope) of the inspection result by the inspection apparatus with respect to the parameter and variations ($3\sigma$) between objects to be processed (e.g., wafers) becomes smaller, and preferably substantially minimum (extreme) is decided as an optimal parameter during decision. The set parameter of the industrial device is changed to the optimal parameter for use.

In the embodiment, as for a parameter which can be estimated without actually operating the industrial device, minimum data is acquired by the industrial device. After the industrial device is operated, the measurement result by the industrial device is decided in consideration of both the estimated result and the result acquired by operating the industrial device.

As described above, in wafer alignment parameter optimization OAP for an exposure apparatus according to the embodiment, an optimal parameter value can be set for each wafer in feedback, or without stopping volume production using a send-ahead wafer in feed forward. Even if the subsequent process varies, the parameter can be changed to an optimal one during volume production. In other words, whether the parameter value of the exposure apparatus is optimal can be decided during volume production, and the parameter value can be optimized.

In the above description, the industrial device is an exposure apparatus, the function is wafer alignment, and the criterion is the inspection result by the overlay inspection apparatus. However, the present invention is not limited to them.

For example, the present invention may be applied to a CMP apparatus or the wafer focusing function of an exposure apparatus.

The exposure apparatus in the above-described embodiment can be a semiconductor exposure apparatus for forming a semiconductor device on a wafer serving as a substrate, an exposure apparatus for exposing a glass substrate to produce a liquid crystal, an exposure apparatus for forming an integrated circuit on the spherical surface of a spherical semiconductor serving as a substrate, or a charged-particle beam exposure apparatus using an electron beam or ion beam as a light source.

The overlay inspection apparatus serving as an OAP criterion may similarly undergo variable optimization using, e.g., a scanning electron microscope SEM as a criterion.

More specifically, when parameter value optimization proposed in this specification is applied to, e.g., a CMP apparatus, the parameter includes the number of turns of a pad and the type of pad, and the inspection apparatus serving as a criterion includes a CD-SEM and profiler. When parameter value optimization is applied to a wafer focusing function, the parameter includes a measurement position within a shot and the type of mark, and the inspection apparatus serving as a criterion includes a CD-SEM.

The present invention can optimize set parameters in volume production in the use of an industrial device without requiring a long time and high cost in addition to volume production. The apparatus can be used with high productivity and high apparatus performance. A manufacturing system with good CoO can be achieved.

The described system and method can easily optimize, e.g., industrial device parameters without decreasing the volume productivity. The effective performance of the apparatus can, therefore, be improved, resulting in high productivity and high yield.

In the above processing, measurement by an operation job and non-operation job and measurement by overlay inspection are performed for all wafers. It is also obvious to those skilled in the art to perform measurement for only a desired wafer ID and to optimize parameters.

The object of the present invention is also achieved when a storage medium which stores software program codes for realizing the functions of the above-described embodiment is supplied to a system or apparatus, and the computer (or the CPU or MPU) of the system or apparatus reads out and executes the program codes stored in the storage medium.

In this case, the program codes read out from the storage medium realize the functions of the above-described embodiment, and the storage medium which stores the program codes constitutes the present invention.

The storage medium for supplying the program codes includes a floppy disk, a hard disk, an optical disk, a magnetooptical disk, a CD-ROM, a CD-R, a magnetic tape, a nonvolatile memory card, and a ROM.

The functions of the above-described embodiment are realized when the computer executes the readout program codes. Also, the functions of the above-described embodiment are realized when an OS (Operating System) or the like running on the computer performs part or all of actual processing on the basis of the instructions of the program codes.

The functions of the above-described embodiment are also realized when the program codes read out from the storage medium are written in the memory of a function expansion board inserted into the computer or the memory of a function expansion unit connected to the computer, and the CPU of the function expansion board or function expansion unit performs part or all of actual processing on the basis of the instructions of the program codes.

A semiconductor device manufacturing process using the above-described semiconductor exposure apparatus will be explained. FIG. 10 shows the flow of the whole manufacturing process of a semiconductor device. In step S201 (circuit design), a semiconductor device circuit is designed. In step S202 (mask formation), a mask having the designed circuit pattern is formed. In step S203 (wafer formation), a wafer is formed as a substrate by using a material such as silicon. In step S204 (wafer process), called a pre-process, an actual circuit is formed on the wafer by lithography using the prepared mask and wafer. Step S205 (assembly), called a post-process, is the step of forming a semiconductor chip by using the wafer formed in step S204, and includes an assembly process (dicing and bonding) and a packaging process (chip encapsulation). In step S206 (inspection), the semiconductor device manufactured in step S205 undergoes inspections such as an operation confirmation test and a durability test. After these steps, the semiconductor device is completed and shipped (step S207). For example, the pre-process and post-process are performed in separate dedicated factories, and each of the factories receives maintenance by a remote maintenance system. Information for production management and apparatus maintenance is communicated between the pre-process factory and the post-process factory via the Internet or dedicated network.

Figure 11:
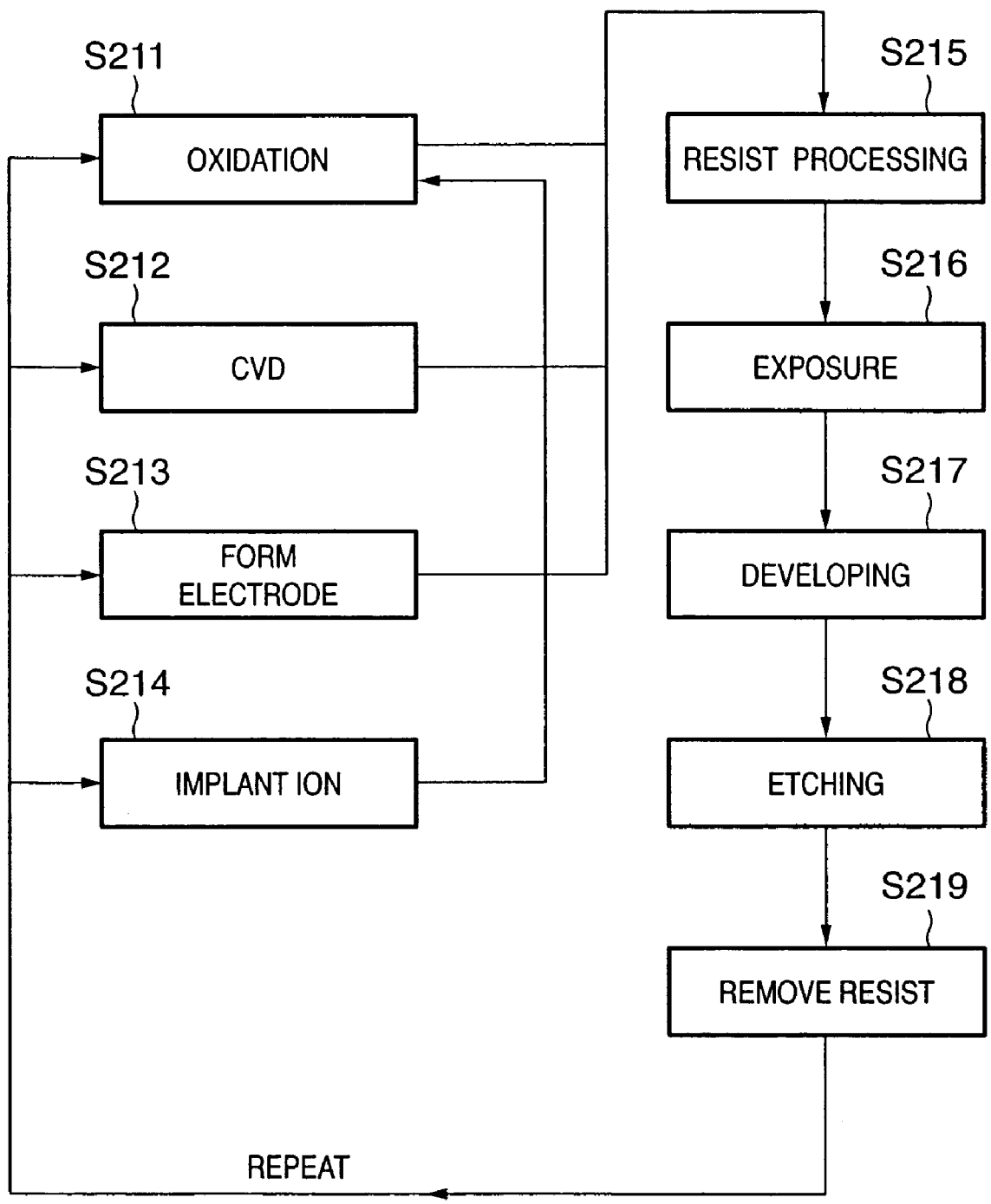
FIG. 11 is a flow chart for explaining a wafer process.

FIG. 11 shows the detailed flow of the wafer process. In step S211 (oxidation), the wafer surface is oxidized. In step S212 (CVD), an insulating film is formed on the wafer surface. In step S213 (electrode formation), an electrode is formed on the wafer by vapor deposition. In step S214 (ion implantation), ions are implanted in the wafer. In step S215 (resist processing), a photosensitive agent is applied to the wafer. In step S216 (exposure), the above-mentioned exposure apparatus exposes the wafer to the circuit pattern of a mask, and prints the circuit pattern on the wafer. In step S217 (developing), the exposed wafer is developed. In step S218 (etching), the resist is etched except the developed resist image. In step S219 (resist removal), an unnecessary resist after etching is removed. These steps are repeated to form multiple circuit patterns on the wafer. The exposure apparatus used in this process is optimized by the above-described management system, which can prevent degradation over time or the like caused by fixed parameters. Even if a change over time occurs, the exposure apparatus can be optimized without stopping volume production, increasing the semiconductor device productivity in comparison with the prior art.

As has been described above, the present invention can optimize a parameter value set in an industrial device during volume production by the industrial device.

As many apparently widely different embodiments of the present invention can be made without departing from the spirit and scope thereof, it is to be understood that the invention is not limited to the specific embodiments thereof except as defined in the claims.

What is claimed is:

1. A management method of managing a parameter for an exposure apparatus which exposes a substrate, said method comprising the steps of:
    measuring, by the exposure apparatus, a position of an alignment mark on the substrate in accordance with a plurality of parameter values of the parameter;
    obtaining evaluation values of measuring results of the exposure apparatus corresponding to the plurality of parameter values of the parameter;
    holding the evaluation values of each of substrates exposed by the exposure apparatus; and
    optimizing the parameter on the basis of a variation amount of the evaluation values for each substrate to be exposed.

2. The method according to claim 1, wherein, in the optimizing step, when the variation amount falls outside a predetermined range, a set parameter value of the parameter is changed so as to make the variation amount fall within the predetermined range.

3. The method according to claim 1, wherein
    the exposure apparatus exposes the substrate on the basis of a measurement result corresponding to a parameter value of the parameter, and
    a shift amount of the measurement result obtained by actually measuring an exposure result of the substrate by an overlay inspection apparatus is used as the evaluation value.

4. The method according to claim 1, wherein the parameter is one of a number of sample shots used for AGA, a layout of sample shots used for AGA, an illumination mode, a line width of the alignment mark, and a processing window width.

5. The method according to claim 1, wherein, in the optimizing step, a set parameter value of the parameter is decided from a region where the variation amount becomes minimum.

6. A management method of managing a parameter for an exposure apparatus which exposes a substrate, said method comprising the steps of:
    measuring, by the exposure apparatus, a position of an alignment mark on the substrate in accordance with a plurality of parameter values of the parameter;

obtaining evaluation values of measuring results of the exposure apparatus corresponding to the plurality of parameter values of the parameter;

holding the evaluation values; and optimizing the parameter on the basis of a sensitivity representing a change degree of the evaluation values upon the change in the parameter value.

7. The method according to claim 6, wherein, in the optimizing step, when the sensitivity falls outside a predetermined range, a set parameter value of the parameter is changed so as to make the sensitivity fall within the predetermined range.

8. The method according to claim 6, wherein the exposure apparatus exposes the substrate on the basis of a measurement result corresponding to a parameter value of the parameter, and a shift amount of the measurement result obtained by actually measuring an exposure result of the substrate by an overlay inspection apparatus is used as the evaluation value.

9. The method according to claim 6, wherein the parameter is one of a number of sample shots used for AGA, a layout of sample shots used for AGA, an illumination mode, a line width of the alignment mark, and a processing window width.

10. The method according to claim 6, wherein, in the optimizing step, a set parameter value of the parameter is decided from a region where the sensitivity becomes minimum.

* * * * *

UNITED STATES PATENT AND TRADEMARK OFFICE
CERTIFICATE OF CORRECTION

PATENT NO. : 7,373,213 B2 Page 1 of 1
APPLICATION NO. : 10/901106
DATED : May 13, 2008
INVENTOR(S) : Satoru Oishi et al.

It is certified that error appears in the above-identified patent and that said Letters Patent is hereby corrected as shown below:

COLUMN 6:
Line 16, "L=20 μm) As" should read -- (L=20 μm). As --.

Signed and Sealed this

Twenty-first Day of October, 2008

JON W. DUDAS
*Director of the United States Patent and Trademark Office*